(12) United States Patent
Watanabe et al.

(10) Patent No.: US 11,189,594 B2
(45) Date of Patent: Nov. 30, 2021

(54) BONDING APPARATUS AND BONDING METHOD

(71) Applicant: SHINKAWA LTD., Tokyo (JP)

(72) Inventors: Osamu Watanabe, Tokyo (JP); Yoshihito Hagiwara, Tokyo (JP); Tomonori Nakamura, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 116 days.

(21) Appl. No.: 16/499,869

(22) PCT Filed: Mar. 22, 2018

(86) PCT No.: PCT/JP2018/011382
§ 371 (c)(1),
(2) Date: Nov. 5, 2019

(87) PCT Pub. No.: WO2018/180881
PCT Pub. Date: Oct. 4, 2018

(65) Prior Publication Data
US 2020/0098721 A1    Mar. 26, 2020

(30) Foreign Application Priority Data
Mar. 30, 2017   (JP) .............................. JP2017-067597

(51) Int. Cl.
*H01L 21/00* (2006.01)
*H01L 23/00* (2006.01)

(52) U.S. Cl.
CPC .............. *H01L 24/75* (2013.01); *H01L 24/81* (2013.01); *H01L 24/83* (2013.01); *H01L 24/16* (2013.01); *H01L 24/32* (2013.01); *H01L 24/73* (2013.01); *H01L 24/92* (2013.01); *H01L 2224/16225* (2013.01); *H01L 2224/32225* (2013.01); *H01L 2224/73204* (2013.01);
(Continued)

(58) Field of Classification Search
None
See application file for complete search history.

(56) References Cited

U.S. PATENT DOCUMENTS 8,720,519 B2    5/2014    Yamagami et al.

FOREIGN PATENT DOCUMENTS

JP    2003007771    1/2003
JP    2006066767    3/2006
(Continued)

OTHER PUBLICATIONS

"International Search Report (Form PCT/ISA/210)" of PCT/JP2018/011382, dated Jun. 19, 2018, with English translation thereof, pp. 1-2.

*Primary Examiner* — Reema Patel
(74) *Attorney, Agent, or Firm* — JCIPRNET

(57) ABSTRACT

A bonding apparatus and a bonding method are provided. The bonding apparatus bonds a semiconductor die to a substrate by thermocompression through an adhesive material. This bonding apparatus is provided with: a bonding tool which has a bonding surface that holds the semiconductor die through a first portion of a tape, and a pair of first tape constraining surfaces that are arranged so as to sandwich the bonding surface and constrain a second portion of the tape: tape constraining mechanisms which have a second tape constraining surface that presses the tape against the first tape constraining surfaces; and a control part which controls the movements of the bonding tool and the tape constraining mechanisms.

9 Claims, 22 Drawing Sheets

(52) U.S. Cl.
CPC ............... *H01L 2224/75252* (2013.01); *H01L 2224/75317* (2013.01); *H01L 2224/75745* (2013.01); *H01L 2224/81191* (2013.01); *H01L 2224/81203* (2013.01); *H01L 2224/83192* (2013.01); *H01L 2224/83203* (2013.01); *H01L 2224/83862* (2013.01); *H01L 2224/9211* (2013.01)

(56) References Cited

FOREIGN PATENT DOCUMENTS

| | | |
|---|---|---|
| JP | 4780858 | 9/2011 |
| JP | 2012028594 | 2/2012 |
| JP | 2012044071 | 3/2012 |

BONDING APPARATUS AND BONDING METHOD

CROSS-REFERENCE TO RELATED APPLICATION

This application is a 371 application of the international PCT application serial no. PCT/JP2018/011382, filed on Mar. 22, 2018, which claims the priority benefit of Japan application no. 2017-067597, filed on Mar. 30, 2017. The entirety of each of the abovementioned patent applications is hereby incorporated by reference herein and made a part of this specification.

TECHNICAL FIELD

The present disclosure relates to a bonding apparatus and a bonding method.

BACKGROUND ART

Mounting technologies for bonding an electronic component such as a semiconductor die on a substrate are known. According to a mounting technology disclosed in Patent Literature 1, for example, a resin film (adhesive) is supplied to a substrate first in order to facilitate control of the amount of the adhesive supplied. Then, a semiconductor die is bonded to the substrate through the resin film. At the time of the bonding, the semiconductor die is held by a bonding tool.

CITATION LIST

Patent Literature

[Patent Literature 1] Japanese Patent No. 4780858

SUMMARY OF INVENTION

Technical Problem

However, the adhesive on the substrate is melted due to heating of the bonding tool. Further, the molten adhesive may crawl upward from a side surface of the semiconductor die due to compression of the bonding tool against the semiconductor die. Adhesion of the adhesive to a distal end of the bonding tool may occur due to the molten adhesive crawling upward. Also, in a case in which the adhesive is heated, melted, and mounted, fume gas is generated from the adhesive. The fume gas enters a suctioning hole of the bonding tool. As a result, the bonding tool may be contaminated in some cases.

The disclosure was made in view of such circumstances. In the disclosure, a bonding apparatus and a bonding method that enable satisfactory bonding of an electronic component to a substrate through an adhesive material are described.

Solution to Problem

According to the disclosure, there is provided a bonding apparatus which bonds an electronic component to a substrate or another electronic component by thermocompression through an adhesive material, the bonding apparatus including: a bonding tool which has a bonding surface that detachably holds the electronic component through a first portion of a sheet member with air permeability, and a pair of first sheet constraining surfaces that are arranged on both sides of the bonding surface to sandwich the bonding surface on an axial line that is parallel to the bonding surface and constrain a second portion of the sheet member; sheet constraining parts which have a second sheet constraining surface that presses the sheet member on the first sheet constraining surfaces against the first sheet constraining surfaces and which constrains the second portion of the sheet member sandwiched between the first sheet constraining surfaces and the second sheet constraining surface; and a bonding control part which controls operations of the bonding tool and the sheet constraining parts.

The bonding apparatus bonds an electronic component by thermocompression. Then, the bonding surface that holds the electronic component is heated to heat the electronic component in a process for performing bonding. The heat provided to the bonding surface is delivered to the electronic component via the sheet. Here, since the second portion of the sheet is constrained by the sheet constraining parts, thermal deformation of the sheet that would occur due to the heating of the sheet is curbed according to the aforementioned configuration. As a result, it is possible to reliably cover the bonding surface holding the electronic component with the first portion of the sheet. Therefore, it is possible to curb adhesion of the molten adhesive material to the bonding surface. As a result, the bonding apparatus can perform satisfactory bonding.

Advantageous Effects of Invention

The bonding apparatus according to the disclosure can satisfactorily bond an electronic component to a substrate through an adhesive material.

DESCRIPTION OF EMBODIMENTS

Figure 1:
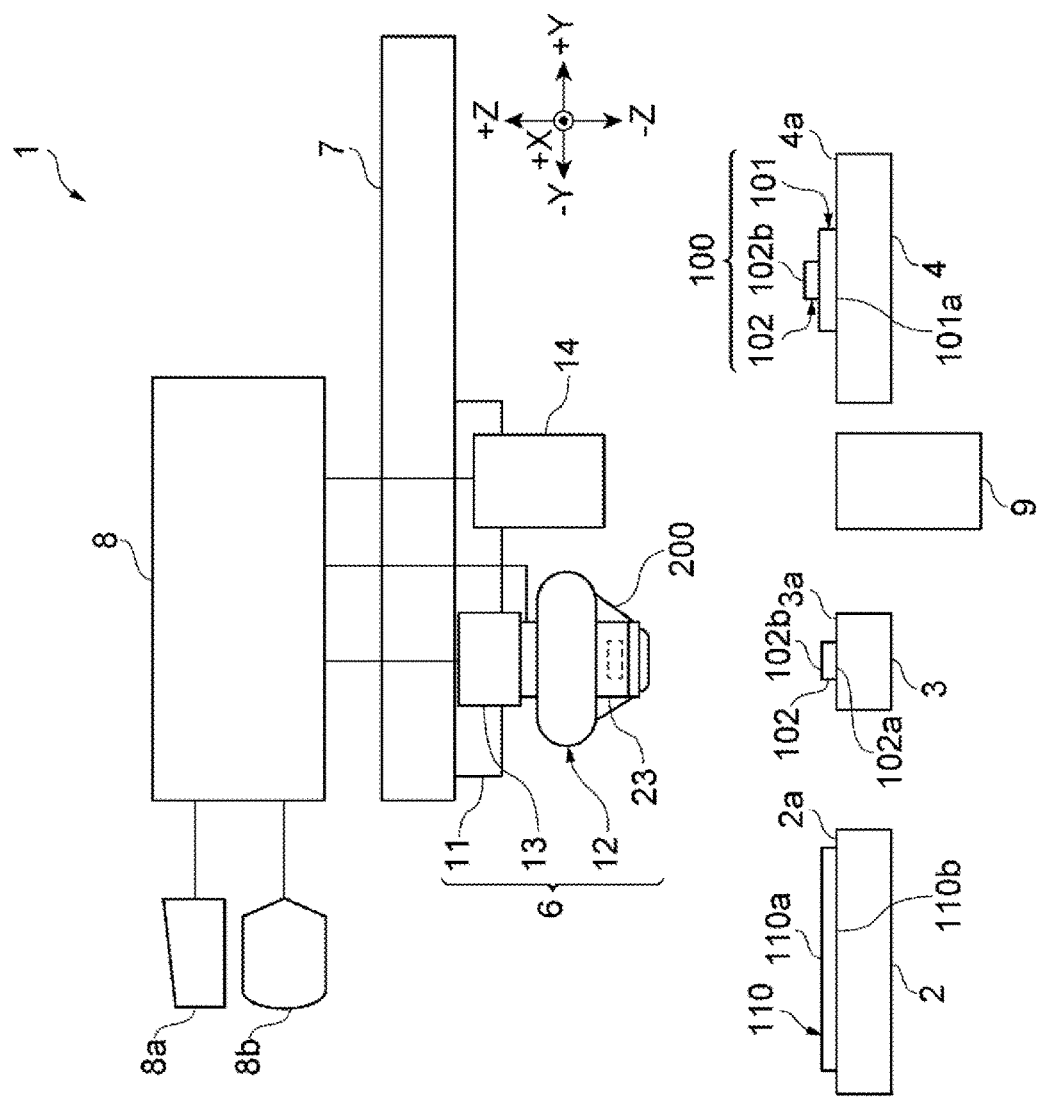
FIG. 1 is an outline diagram illustrating a configuration of a bonding apparatus according to a first disclosure.

Hereinafter, embodiments for implementing bonding apparatuses and bonding methods according to the first disclosure and the second disclosure will be described in detail with reference to accompanying drawings. In description of the drawings, the same reference numerals will be given to the same elements, and repeated description will be omitted.

Here, a sheet for preventing the crawling upward is sandwiched between a bonding head and a semiconductor die. The crawling prevention sheet allows for air permeation. The bonding head holds the semiconductor die with vacuum provided from a suctioning hole using the air permeation. That is, in the following description, having air permeability means that the crawling prevention sheet has performance of transmitting air therethrough to such an extent that the bonding head can hold the semiconductor die. As the crawling prevention sheet with air permeability, a porous sheet, a non-woven cloth, or a sheet with air permeation holes, for example, may be employed as will be described later. However, a configuration of the sheet is not to be interpreted as being limited thereto.

As illustrated in FIG. 1, a bonding apparatus 1 mounts a semiconductor die 102 in a bonding region of a substrate 101. The semiconductor die 102 is an example of an electronic component. By mounting the semiconductor die 102, a semiconductor device 100 provided with the substrate 101 and the semiconductor die 102 is obtained. In the following description, an X axis and a Y axis, which orthogonally intersect one another, are oriented in directions that are parallel to a main surface of the semiconductor die 102 (or a main surface of any one stage). A Z axis is directed in a direction that is perpendicular to both the X axis and the Y axis.

Figure 2:
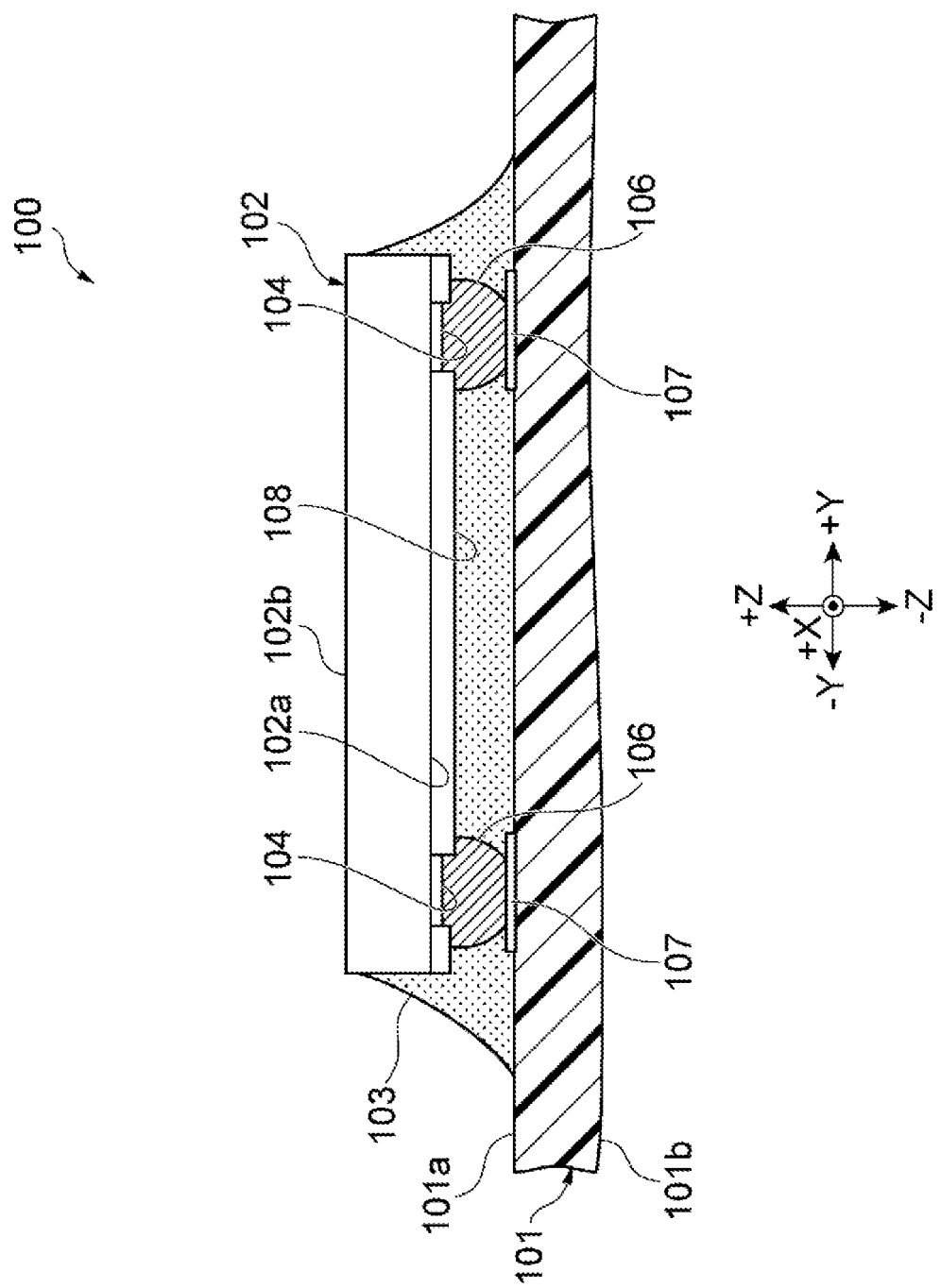
FIG. 2 is a sectional view of a semiconductor device assembled by the bonding apparatus illustrated in FIG. 1.

The bonding apparatus 1 assembles the semiconductor device 100. Next, the semiconductor device 100 will be described. As illustrated in FIG. 2, the semiconductor device 100 has the substrate 101 and the semiconductor die 102.

The substrate 101 has a shape of an individual plate piece. The substrate 101 has a first main surface 101a and a second main surface 101b. The first main surface 101a has at least one placement region. The semiconductor die 102 is placed in the placement region. Therefore, the semiconductor die 102 is bonded to the first main surface 101a of the substrate 101. The second main surface 101b is a rear surface of the first main surface 101a. A material of the substrate 101 is, for example, an organic material (for example, an epoxy substrate or a polyimide substrate), an inorganic material (for example, a glass substrate), or a composite material thereof (for example, a glass epoxy substrate). The substrate 101 is a so-called interposer.

In addition, the substrate 101 may have a plurality of placement regions. In this case, semiconductor dies 102 are bonded to the respective placement regions on the substrate. Thereafter, the substrate is divided into individual pieces for the respective placement regions. As a result, a plurality of semiconductor devices 100 are obtained. Also, the semiconductor device 100 may have a stacked structure. The stacked structure is a structure in which a plurality of semiconductor dies 102 are layered. In the semiconductor device with a stacked structure, all two or more semiconductor dies 102 may be directed in the same direction. Alternatively, in the semiconductor device with a stacked structure, two or more semiconductor dies 102 may be directed in mutually different directions. In addition, two or more semiconductor dies 102 may be bonded to one placement region for the semiconductor devices.

Each semiconductor die 102 is secured to the substrate 101 with an adhesive material 103 such as a thermosetting resin.

The semiconductor die 102 has a shape of an individual plate piece that is smaller than the substrate 101 in a plan view. The semiconductor die 102 has a first main surface 102a and a second main surface 102b. The first main surface 102a has a predetermined circuit pattern. The first main surface 102a further has a plurality of electrode pads 104, a plurality of bump electrodes 106, and a protection film 108. In addition, the first main surface 102a faces the first main surface 101a of the substrate 101. Such a bonding configuration is called face-down bonding. The second main surface 102b is a rear surface on the opposite side of the first main surface 102a. The semiconductor die 102 is formed using a semiconductor material such as silicon.

The electrode pads 104 are electrically connected to an electrode pad 107 formed on the first main surface 101a. The bump electrodes 106 are provided on the electrode pads 104. The protection film 108 is provided in the surroundings of the plurality of bump electrodes 106. In other words, the protection film 108 covers external circumferential ends of the electrode pads 104. Meanwhile, the centers of the electrode pads 104 are exposed from the protection film 108. The exposed portions are portions electrically connected to the bump electrodes 106. As materials of the electrode pads 104 and the bump electrodes 106, conductive materials may be employed. For example, aluminum, copper, or the like may be employed as a material of the electrode pads 104. Also, gold or the like may be employed as a material of the bump electrodes 106, for example.

Next, the bonding apparatus 1 will be described. As illustrated in FIG. 1, the bonding apparatus 1 has a wafer stage 2, an intermediate stage 3, a bonding stage 4, a bonding unit 6, an XY stage 7, a bonding control part (hereinafter, simply referred to as a "control part 8"), and an imaging part 9.

The wafer 110 is temporarily placed on the wafer stage 2. The wafer 110 is secured to a placement surface 2a of the wafer stage 2 with an attachment film (not illustrated). The wafer 110 includes a plurality of semiconductor dies 102 formed as individual pieces. The wafer 110 has a first main surface 110a and a second main surface 110b. The first main surface 110a has a predetermined circuit pattern. Also, the first main surface 110a corresponds to the first main surface 102a of each semiconductor die 102. The second main surface 110b is a rear surface on the opposite side of the first main surface 110a. Also, the second main surface 110b corresponds to the second main surface 102b of each semiconductor die 102.

The semiconductor dies 102 are temporarily placed on the intermediate stage 3. The semiconductor dies 102 are secured to a placement surface 3a of the intermediate stage 3 with an attachment film (not illustrated). The intermediate stage 3 is disposed between the wafer stage 2 and the bonding stage 4. The intermediate stage 3 has a driving mechanism such as a linear motor (not illustrated). The intermediate stage 3 can move in the X-axis direction and the Y-axis direction.

In a process of causing the semiconductor dies 102 to move from the wafer stage 2 to the bonding stage 4, the semiconductor dies 102 are picked up from the wafer stage 2. Then, the semiconductor dies 102 are vertically inverted. That is, in an initial state, the first main surfaces 102a are located on the upper side while the second main surfaces 102b are located on the lower side. After the semiconductor dies 102 are vertically inverted, the second main surfaces 102b are located on the upper side while the first main surfaces 102a are located on the lower side. In this state, the semiconductor dies 102 are placed on the intermediate stage 3. Therefore, the first main surfaces 102a face the placement surface 3a of the intermediate stage 3 when the semiconductor dies 102 are placed on the intermediate stage 3.

The substrate 101 undergoing bonding is temporarily placed on the bonding stage 4. The substrate 101 is secured to a placement surface 4a of the bonding stage 4 with an attachment film (not illustrated). At this time, the first main surface 101a of the substrate 101 faces the placement surface 4a of the bonding stage 4. The bonding stage 4 has a driving mechanism (not illustrated) including a guide rail. The bonding stage 4 causes the substrate 101 to move in the X-axis direction. Also, the bonding stage 4 has a heater for heating the substrate 101.

The bonding unit 6 has a bonding head 11, a bonding tool 12, a Z-axis driving mechanism 13, and an imaging part 14. The bonding head 11 is attached to the XY stage 7. The bonding head 11 can move in the X-axis direction and the Y-axis direction. The bonding tool 12 is attached to the bonding head 11 via the Z-axis driving mechanism 13. The imaging part 14 is also attached to the bonding head 11. That is, if the bonding head 11 is moved by the XY stage 7, the bonding tool 12 and the imaging part 14 attached to the bonding head 11 also move. Also, the imaging part 14 may not be secured to the bonding head 11. The imaging part 14 may be able to move separately from the bonding tool 12.

The imaging part 14 is separated from the bonding tool 12 by a predetermined distance in the Y-axis direction. The imaging part 14 images the second main surfaces 102b of the semiconductor dies 102 placed on the intermediate stage 3. Also, the imaging part 14 images the second main surfaces 102b of the semiconductor dies 102 placed on the bonding stage 4.

The bonding tool 12 has a bonding distal end 23. The bonding distal end 23 holds the semiconductor dies 102. The bonding distal end 23 is an end of the bonding tool 12, which extends in the Z-axis direction, on the side of the bonding stage 4. Also, the bonding tool 12 has an air vacuum function and/or an air blow function. With these functions, the bonding tool 12 can adsorb or release the semiconductor dies 102. In the bonding apparatus 1 according to the first disclosure, the bonding tool 12 holds the semiconductor dies 102 via a tape 200. Also, a configuration of the bonding tool 12 will be described later.

Incidentally, the tape 200 has a plurality of holes for ventilation between one main surface and the other main surface. A Gurley value of the tape 200 may be small in order to adsorb the electronic component such as the semiconductor dies 102. The Gurley value of the tape 200 may be, for example, 1 to 2 (s/100 cc/in$^2$).

Also, the tape 200 is softer than a semiconductor material of the semiconductor dies 102 that are targets of bonding. In addition, the tape 200 is softer than a material that forms the bonding distal end 23. "Softer" described here means that rigidity of the tape 200 is lower than rigidity of the semiconductor dies 102, for example. A non-woven cloth tape, for example, may be employed as the tape 200.

A material of the tape 200 is not particularly limited. For the tape 200, a tetrafluoroethylene resin (PTFE) or polyimide may be employed in one example. In a case in which a tetrafluoroethylene resin is used for the tape 200, for example, the tetrafluoroethylene resin may be PTFE nanofibers. The PTFE nanofibers that have a hole diameter of equal to or greater than about 1 μm and equal to or less than 2 μm, a thickness of about 56 μm, and a Gurley value of 1.2 (s/100 cc/in$^2$) may be used. The PTFE nanofibers can reduce the Gurley value (that is, improve breathability) while securing the thickness.

The control part 8 controls operations of components of the bonding apparatus 1. Specifically, the control part 8 is connected to the respective configurations such as the bonding unit 6, the XY stage 7, and the imaging parts 9 and 14 such that signals can be transmitted and received therebetween. Therefore, the control part 8 controls operations of the bonding unit 6, the XY stage 7, the imaging parts 9 and 14, and the like. For example, the control part 8 is a computer device provided with a CPU, a memory, and the like. The memory stores a bonding program and the like for performing processing required for the bonding. The control part 8 is configured to be able to execute the respective processes related to the semiconductor die bonding method according to the first disclosure, which will be described later. An operation part 8a for inputting control information and a display part 8b for outputting control information are connected to the control part 8.

The control part 8 performs position control (XYZ axes) of the bonding unit 6. Also, the control part 8 performs position control (Z axis) of the bonding tool 12. Further, the control part 8 performs position control (θ) of the bonding tool 12 around the Z axis. Moreover, the control part 8 performs tilt control (inclination relative to the Z axis) of the bonding tool 12. Further, the control part 8 performs control to start or stop an air vacuum operation and/or an air blow operation. Also, the control part 8 performs load control when the semiconductor dies 102 are mounted on the substrate 101, heat supply control of the bonding stage 4, heat supply control of the bonding tool 12, constraining operation control of the tape 200, and the like.

Figure 3:
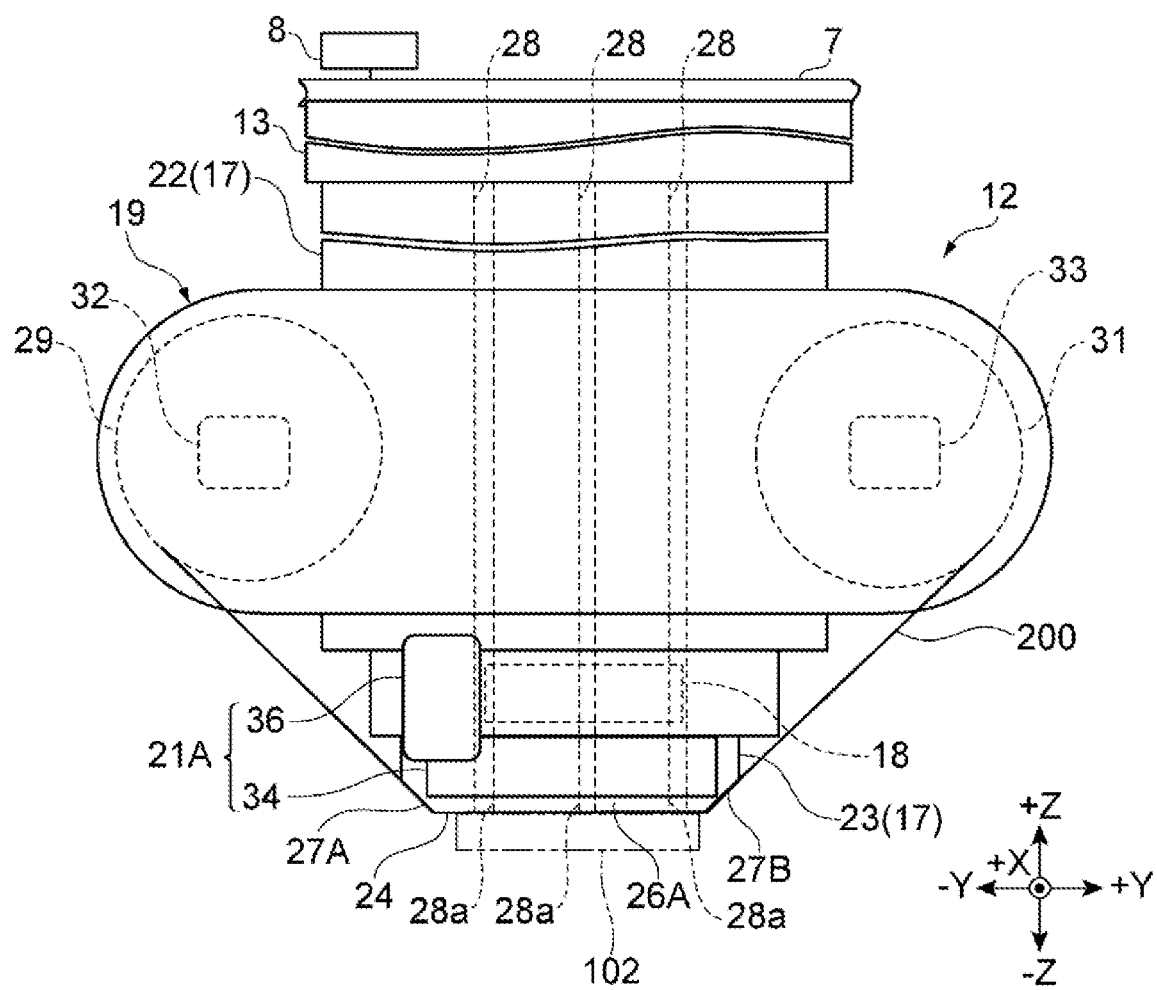
FIG. 3 is an enlarged view of a bonding tool in the bonding apparatus illustrated in FIG. 1.

Hereinafter, the bonding tool 12 will be described in further detail with reference to FIGS. 3 and 4A and 4B. As illustrated in FIG. 3, the bonding tool 12 has a body 17, a heater 18 (heating part), a tape transport mechanism 19

Figure 4A:
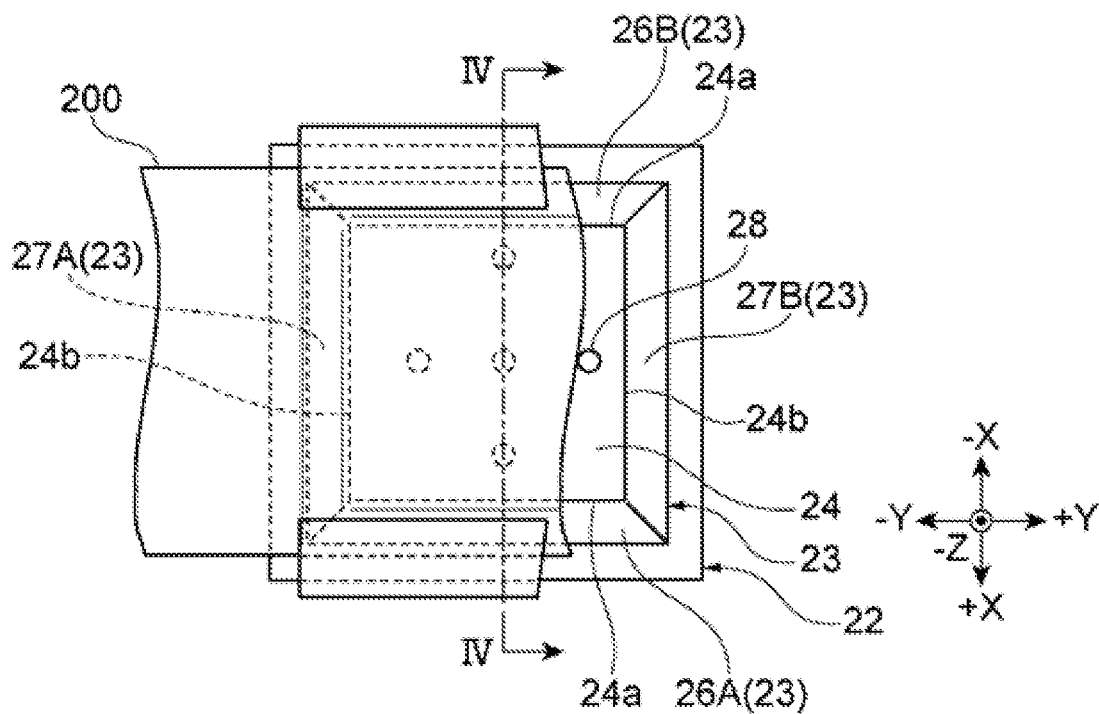
FIG. 4A is a plan view of a bonding surface.
Figure 4B:
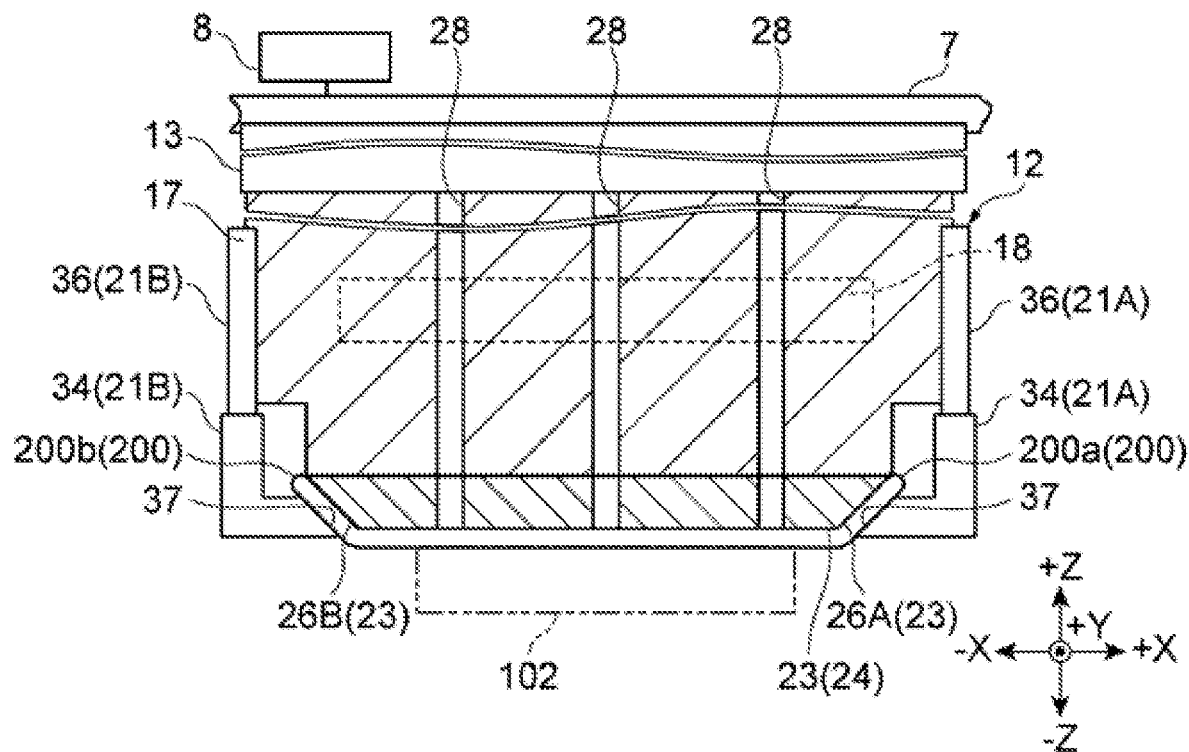
FIG. 4B is a sectional view taken along the line IV-IV illustrated in FIG. 4A.
Figure 5:
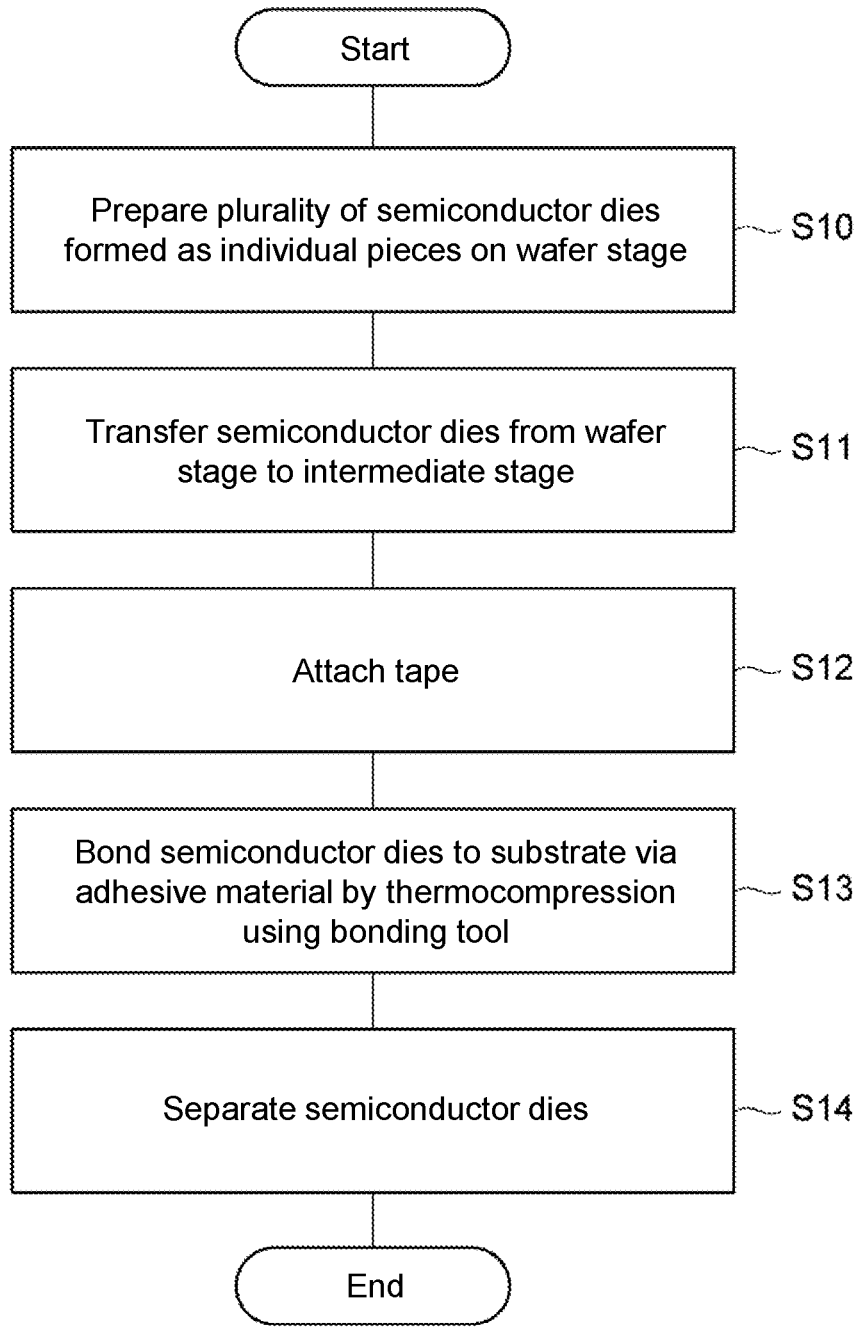
FIG. 5 is a flow diagram illustrating main processes of a bonding method using the bonding apparatus illustrated in FIG. 1.

(sheet supply part), and a pair of tape constraining mechanisms 21A and 21B (sheet constraining parts) (see FIG. 4B for the tape constraining mechanism 21B).

The body 17 has a base part 22 and a bonding distal end 23. The base part 22 has a square columnar shape. Also, the base part 22 may have a circular columnar shape. An upper end of the base part 22 is coupled to the Z-axis driving mechanism 13. A lower end of the base part 22 is attached to the bonding distal end 23. The bonding distal end 23 has a so-called truncated square pyramid shape. The bonding distal end 23 has a bonding surface 24, a pair of first tape constraining surfaces 26A and 26B (first sheet constraining surfaces; see FIGS. 4A and 4B), and a pair of tape transport surfaces 27A and 27B. The bonding surface 24 is a lower end surface of the bonding distal end 23. The bonding surface 24 detachably holds the semiconductor dies 102 via the tape 200. Attachment and detachment of the semiconductor dies 102 are performed by a plurality of suctioning holes 28. The suctioning holes 28 are provided at the base part 22 and the bonding distal end 23. Upper ends of the suctioning holes 28 are connected to an air pressure system such as a pump (not illustrated). Lower ends of the suctioning holes 28 form openings 28a in the bonding surface 24. The first tape constraining surfaces 26A and 26B (see FIG. 4A) are a pair of oblique surfaces of the bonding distal end 23. The first tape constraining surfaces 26A and 26B are substantially parallel to the transport direction (Y-axis direction) of the tape 200. The first tape constraining surfaces 26A and 26B are continuous with the bonding surface 24 via a pair of first boundary side parts 24a (see FIG. 4A). That is, the first tape constraining surfaces 26A and 26B are disposed on both sides of the bonding surface 24. The tape transport surfaces 27A and 27B are another pair of oblique surfaces of the bonding distal end 23. The tape transport surfaces 27A and 27B are inclined relative to the transport direction (Y-axis direction) of the tape 200. The tape transport surfaces 27A and 27B are continuous with the bonding surface 24 via a pair of second boundary side parts 24b. That is, the first tape constraining surfaces 26A and 26B and the tape transport surfaces 27A and 27B have tapered shapes. In other words, the first tape constraining surfaces 26A and 26B and the tape transport surfaces 27A and 27B become thinner toward the bonding surface 24.

The heater 18 is disposed inside the body 17. The heater 18 heats the semiconductor dies 102. Also, the heater 18 may heat the substrate 101. The heater 18 performs switching between start and stop of the heating operation in accordance with a control signal received from the control part 8.

The tape transport mechanism 19 transports the tape 200 to the bonding surface 24. Also, the tape transport mechanism 19 collects the used tape 200. The tape transport mechanism 19 is attached to the body 17. The position of the tape transport mechanism 19 is above the position of the bonding distal end 23. The tape transport mechanism 19 has a supply reel 29 (first reel) and a collection reel 31 (second reel). The supply reel 29 and the collection reel 31 sandwich the bonding distal end 23 therebetween. The tape 200 let off from the supply reel 29 is rewound around the collection reel 31 via the bonding surface 24.

A first end of the tape 200 is attached to the supply reel 29. A second end of the tape 200 is attached to the collection reel 31. The supply motor 32 is attached to the supply reel 29. In addition, the collection motor 33 is attached to the collection reel 31. The supply motor 32 and the collection motor 33 perform various operations in accordance with control signals received from the control part 8. First, the supply motor 32 causes the supply reel 29 to rotate in the clockwise direction. Also, the collection motor 33 causes the collection reel 31 to rotate in the counterclockwise direction. Further, the supply motor 32 brings the supply reel 29 into a rotation constrained state. Further, the collection motor 33 brings the collection reel 31 into a rotation constrained state. The rotation constrained state means a state in which rotation of the supply reel 29 and the collection reel 31 is not allowed. Further, the supply motor 32 brings the supply reel 29 into a rotatable state. Also, the collection motor 33 brings the collection reel 31 into a rotatable state. The rotatable state means a state in which free rotation of the supply reel 29 and the collection reel 31 is allowed.

As illustrated in FIGS. 4A and 4B, the tape constraining mechanism 21A constrains a side part 200a of the tape 200. Also, the tape constraining mechanism 21B constrains a side part 200b of the tape 200. The side parts 200a and 200b are a pair of free side parts. The tape constraining mechanism 21A is disposed at a position at which the tape constraining mechanism 21A faces the first tape constraining surface 26A. The tape constraining mechanism 21B is disposed at a position at which the tape constraining mechanism 21B faces the first tape constraining surface 26B. That is, the tape constraining mechanisms 21A and 21B extend in the transport direction (Y-axis direction) of the tape 200. The tape constraining mechanism 21A has a tape constraining frame 34 and a frame driving mechanism 36. Also, the tape constraining mechanism 21B also has a tape constraining frame 34 and a frame driving mechanism 36.

The tape constraining frame 34 of the tape constraining mechanism 21A presses the side part 200a of the tape 200 against the bonding distal end 23. Through the pressing, the tape 200 is sandwiched between the tape constraining frame 34 and the bonding distal end 23. The tape constraining frame 34 has a second tape constraining surface 37 (second sheet constraining surface). The second tape constraining surface 37 faces the first tape constraining surface 26A. Also, the second tape constraining surface 37 follows the first tape constraining surface 26A.

The tape constraining frame 34 of the tape constraining mechanism 21B presses the side part 200b of the tape 200 against the bonding distal end 23. Through the pressing, the tape 200 is sandwiched between the tape constraining frame 34 and the bonding distal end 23. The tape constraining frame 34 of the tape constraining mechanism 21B has a second tape constraining surface 37. The second tape constraining surface 37 faces the first tape constraining surface 26B. The second tape constraining surface 37 follows the first tape constraining surface 26A.

The frame driving mechanism 36 causes the tape constraining frame 34 to reciprocate in the upward-downward direction (Z-axis direction) in accordance with a control signal provided from the control part 8. Therefore, the tape constraining frame 34 can be in a non-constrained state and a constrained state. The non-constrained state is a state in which the tape constraining frame 34 is separated from the bonding distal end 23 in the negative Z-axis direction. The constrained state is a state in which the tape constraining frame 34 is pressed toward the bonding distal end 23. As the frame driving mechanism 36, a rack-and-pinion mechanism, for example, may be employed.

<Bonding method>

Next, a bonding method using the bonding apparatus 1 will be described with reference to FIGS. 5, 6A and 6B, 7A and 7B, and 8A and 8B. The bonding method according to the first disclosure is performed using the bonding apparatus 1 illustrated in FIG. 1. The semiconductor device 100 (see FIG. 2) is manufactured by the bonding method according to the first disclosure. The semiconductor device 100 has the semiconductor die 102 and the substrate 101. The semiconductor die 102 is mounted on the substrate 101 through the adhesive material 103.

First, a plurality of semiconductor dies 102 formed as individual pieces are prepared on the wafer stage 2 (S10). Specifically, the wafer 110 is prepared on the wafer stage 2 as illustrated in FIG. 1. The wafer 110 includes a plurality of semiconductor dies 102 attached to a film. The first main surfaces 102a of the plurality of semiconductor dies 102 are directed upward. Also, the second main surfaces 102b of the plurality of semiconductor dies 102 face the wafer stage 2.

Next, the semiconductor dies 102 are transferred to the intermediate stage 3 (S11). The plurality of semiconductor dies 102 on the wafer stage 2 are transferred to the intermediate stage 3 one by one through conjunction operations of an adsorption tool and a pick-up unit (both are not illustrated), for example.

Next, a process for attaching the tape 200 to the bonding distal end 23 (S12) is performed.

Figure 6A:
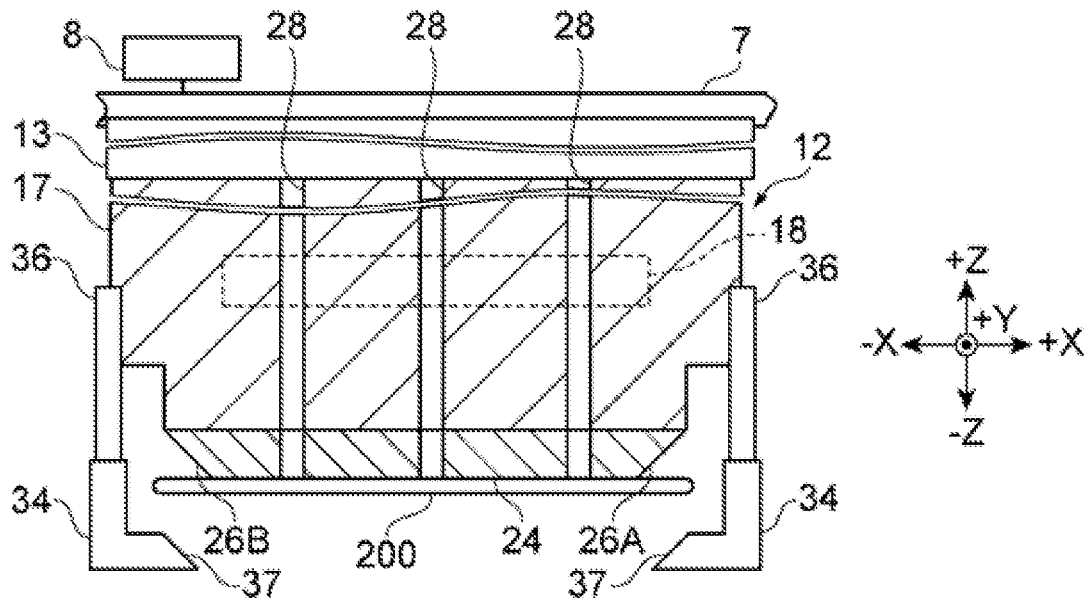
FIG. 6A is a diagram illustrating one process among processes for attaching a tape.
Figure 6B:
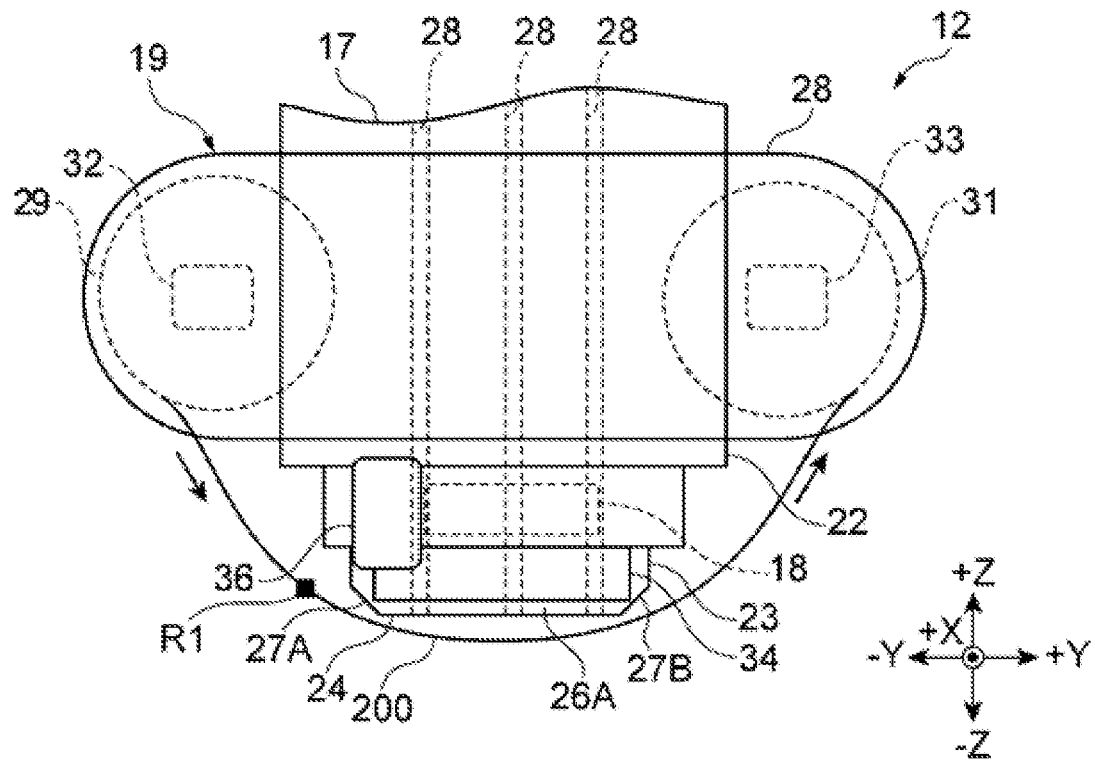
FIG. 6B is a diagram illustrating a process performed after the process illustrated in FIG. 6A.

First, an operation of supplying the tape is performed. As illustrated in FIG. 6A, the control part 8 transmits a control signal to the frame driving mechanism 36. As a result, the tape constraining frame 34 moves in the negative Z-axis direction. The movement may be stopped when movement of the tape constraining frame 34 by a preset distance is detected. The constraint of the tape 200 in a width direction is released by the movement. Next, the control part 8 causes the supply reel 29 to slightly rotate in a counterclockwise direction CCW as illustrated in FIG. 6B. Thus, a tension state of the tape 200 in the transport direction (Y-axis direction) is released. As a result, the tape 200 is loosened. Then, the control part 8 causes the supply reel 29 and the collection reel 31 to operate. As a result, the next first portion R1 moves up to the bonding surface 24. After the first portion R1 moves up to the bonding surface 24, the control part 8 causes the supply reel 29 to rotate in a clockwise direction CW and causes the collection reel 31 to rotate in the counterclockwise direction CCW. Through these operations, the tape 200 gets tensed up again in the transport direction (Y-axis direction).

Figure 7A:
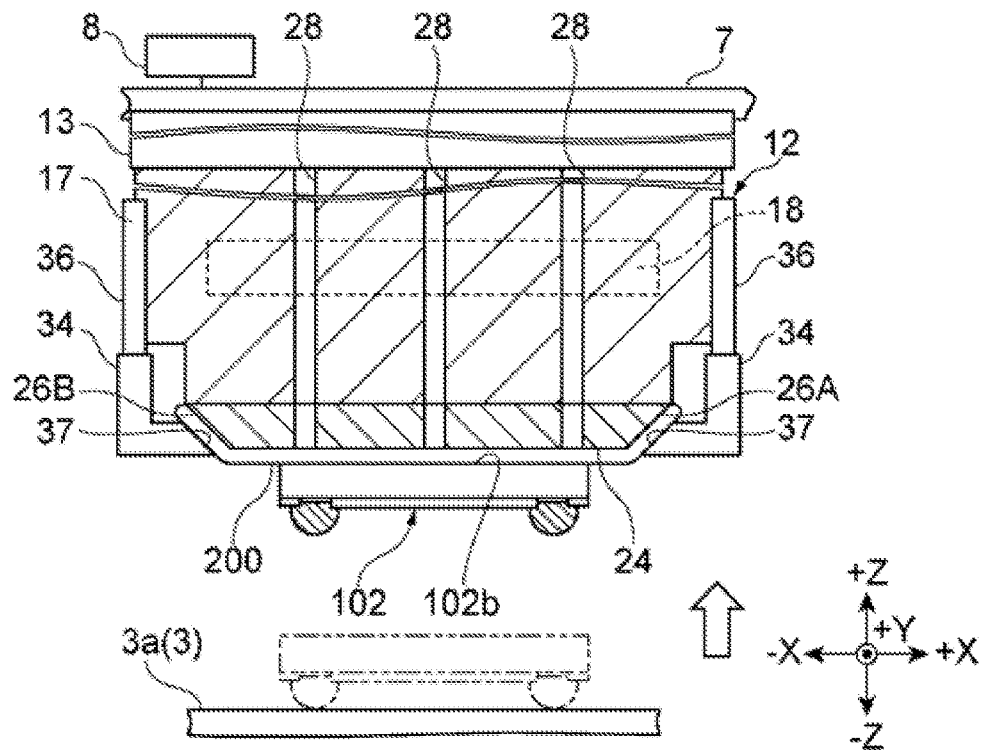
FIG. 7A is a diagram illustrating one process in the processes for attaching a tape.

Next, the control part 8 transmits a control signal to the frame driving mechanism 36 as illustrated in FIG. 7A. As a result, the tape constraining frame 34 moves in the positive Z-axis direction. The movement may be stopped when movement of the tape constraining frame 34 by a preset distance is detected. Through the movement, the tape 200 is sandwiched between the first tape constraining surface 26A and the second tape constraining surface 37. Further, the tape 200 is sandwiched between the first tape constraining surface 26B and the second tape constraining surface 37. Therefore, movement of the tape 200 in the width direction (X-axis direction) is restricted. Then, the control part 8 controls the XY stage 7. As a result, the bonding tool 12 moves to the above of the intermediate stage 3.

Next, the control part 8 controls the Z-axis driving mechanism 13. As a result, the bonding tool 12 moves to the negative Z-axis direction. The control part 8 stops the movement of the bonding tool 12 when the second main surfaces 102b of the semiconductor dies 102 are brought into contact with the tape 200 on the bonding surface 24. Next, the control part 8 controls an air pressure system (not illustrated). As a result, suctioning using the suctioning holes 28 is started. Through the suctioning, the bonding tool 12 adsorbs the semiconductor dies 102. Then, the control part 8 controls the Z-axis driving mechanism 13. As a result, the bonding tool 12 moves in the positive Z-axis direction.

Next, the semiconductor die 102 is bonded to the substrate 101 through the adhesive material 103 by thermocompression (S13). The bonding tool 12 is used for the thermocompression operation.

Figure 7B:
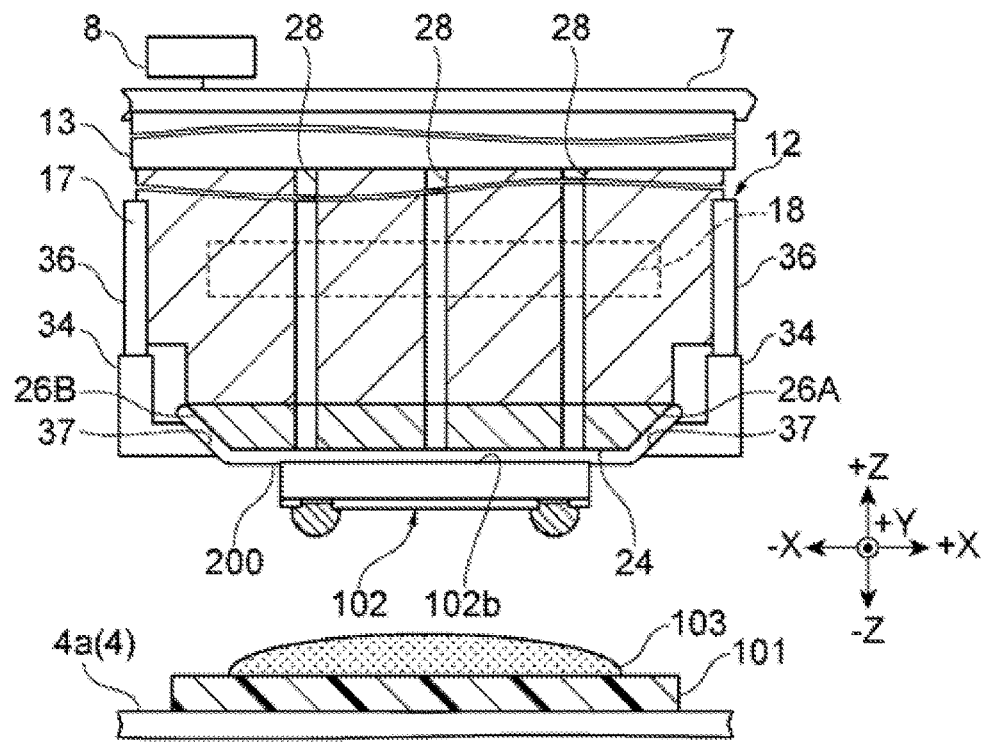
FIG. 7B is a diagram illustrating a process performed after the process illustrated in FIG. 7A.

Specifically, the control part 8 controls the XY stage 7 first as illustrated in FIG. 7B. As a result, the bonding tool 12 adsorbing the semiconductor dies 102 moves to the above of the bonding stage 4. The substrate 101 is disposed on the bonding stage 4. The adhesive material 103 is disposed in the region on the substrate 101 on which the semiconductor dies 102 are mounted. The adhesive material 103 is in a paste state at an ordinary temperature.

Figure 8A:
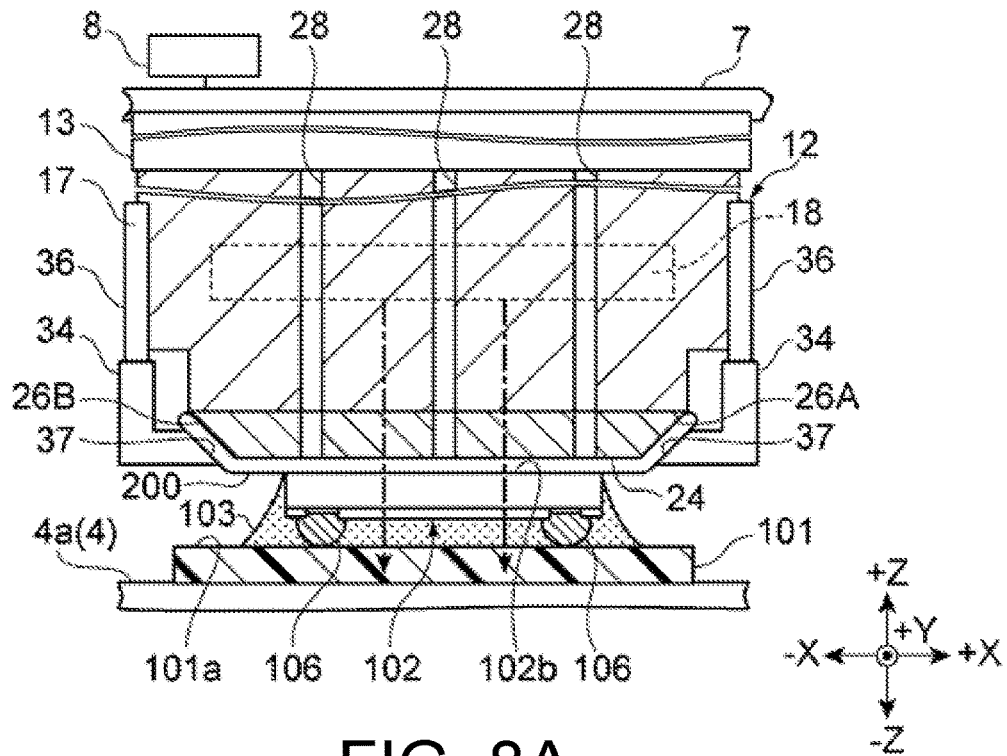
FIG. 8A is a diagram illustrating one process in the processes for attaching a tape.

As illustrated in FIG. 8A, the control part 8 controls the Z-axis driving mechanism 13. As a result, the bonding tool 12 is lowered toward the bonding stage 4. The lowering operation continues until the bump electrodes 106 are brought into contact with the first main surface 101a of the substrate 101. The control part 8 causes the lowering operation to stop if contact of the bump electrodes 106 with the substrate 101 is detected. Also, the control part 8 controls the heater 18. As a result, heating is started. The heating operation may be started during the lowering operation or after the lowering operation ends. Through these operations, the semiconductor dies 102 are brought into contact with the adhesive material 103 first through the lowering operation. Then, heat is delivered from the bonding surface 24 to the adhesive material 103 via the semiconductor dies 102 through the heating operation. Due to the heat, the adhesive material 103 is cured.

Also, the adhesive material may have a film shape at an ordinary temperature. The adhesive material in the film shape is softened by being heated. Therefore, the control part 8 performs the lowering operation and the heating operation in parallel, thereby pressing the semiconductor dies 102 downward while softening the adhesive material in the film shape and bringing the bump electrodes 106 into contact with the substrate 101. Then, the control part 8 stops the heating operation. As a result, the temperature of the adhesive material in the film shape is lowered, and the adhesive material is thus cured. Through the curing, the semiconductor dies 102 are secured to the substrate 101.

In this manner, the bump electrodes 106 of the semiconductor dies 102 are electrically connected to a wiring (not illustrated) of the substrate 101. Further, resin sealing is established between the semiconductor dies 102 and the substrate 101. Also, a configuration of the adhesive material 103 is not limited to the configuration in which the adhesive material 103 is provided in advance on the substrate 101 before the bonding. For example, a portion between the semiconductor dies 102 and the substrate 101 may be filled with the adhesive material 103 as an underlying fill during the bonding process.

Figure 8B:
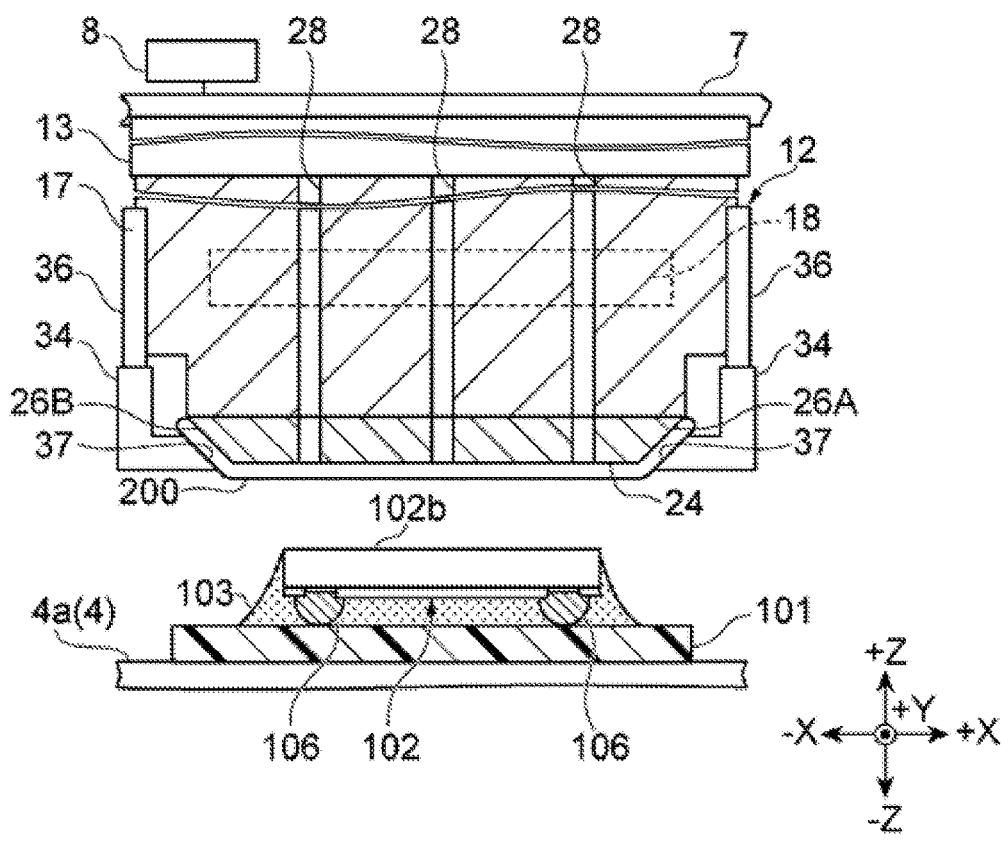
FIG. 8B is a diagram illustrating a process performed after the process illustrated in FIG. 8A.

After the semiconductor dies 102 is bonded to the substrate 101 by thermocompression, the control part 8 stops the suctioning operation of the suctioning holes 28. As a result, the semiconductor dies 102 are separated from the bonding surface 24 as illustrated in FIG. 8B (S14). Thereafter, the control part 8 controls the Z-axis driving mechanism 13. As a result, the bonding tool 12 moves in the positive Z-axis direction. Through these operations, it is possible to separate the semiconductor dies 102 from the bonding surface 24 while keeping the state in which the tape 200 is constrained.

Next, effects and advantages of the bonding apparatus 1 will be described with reference to FIGS. 9A and 9B and 10.

First, operations of a bonding apparatus 300 according to a comparative example will be described. FIGS. 9A and 9B are diagrams of a bonding surface 324 that the bonding apparatus 300 has in a plan view from the negative Z-axis direction. The bonding apparatus 300 according to the comparative example is different from the bonding apparatus 1 according to the first disclosure in that the bonding apparatus 300 does not have the tape constraining mechanism. The other configurations of the bonding apparatus 300 according to the comparative example are similar to those of the bonding apparatus 1 according to the first disclosure.

Figure 9A:
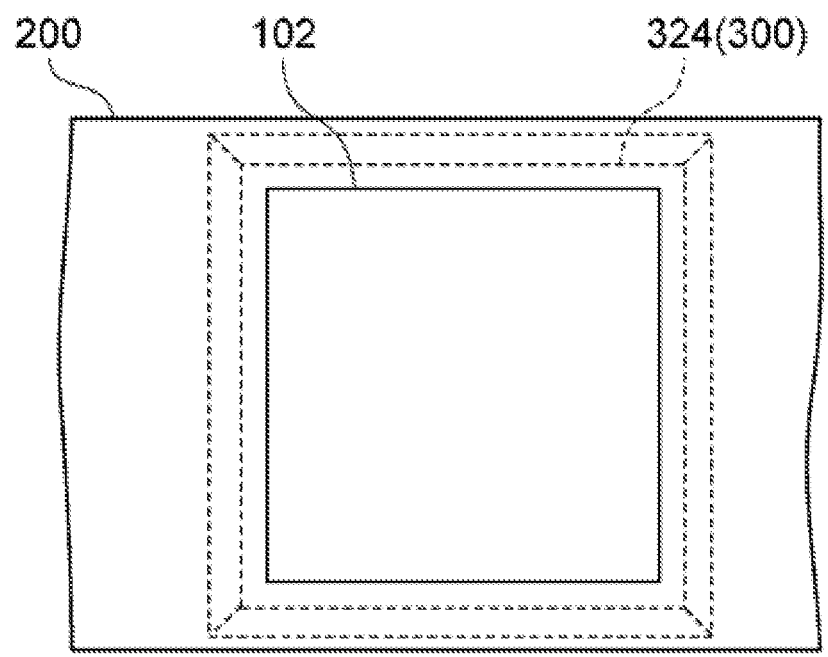
FIGS. 9A and 9B are diagrams illustrating operations of a bonding apparatus according to a comparative example.
Figure 9B:
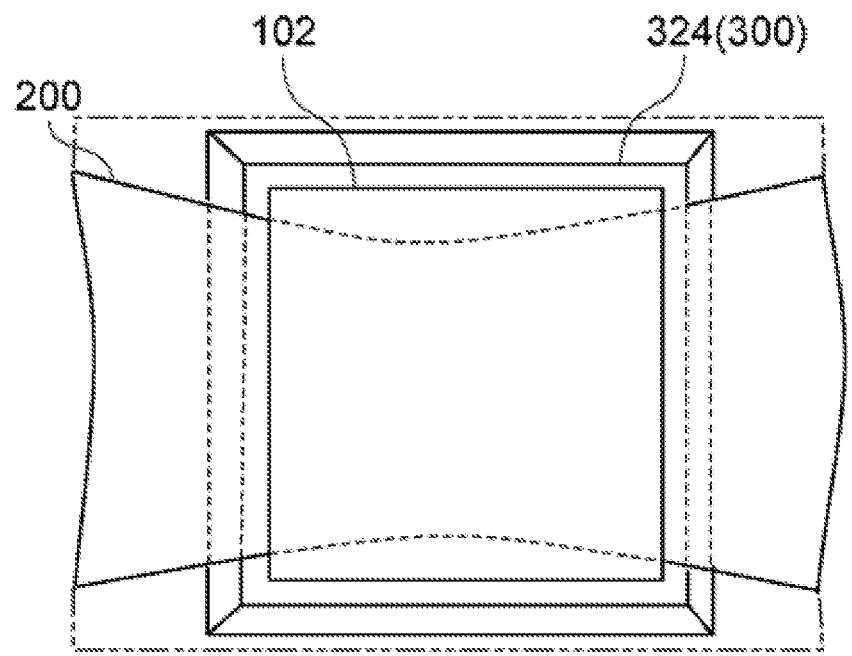
Figure 10:
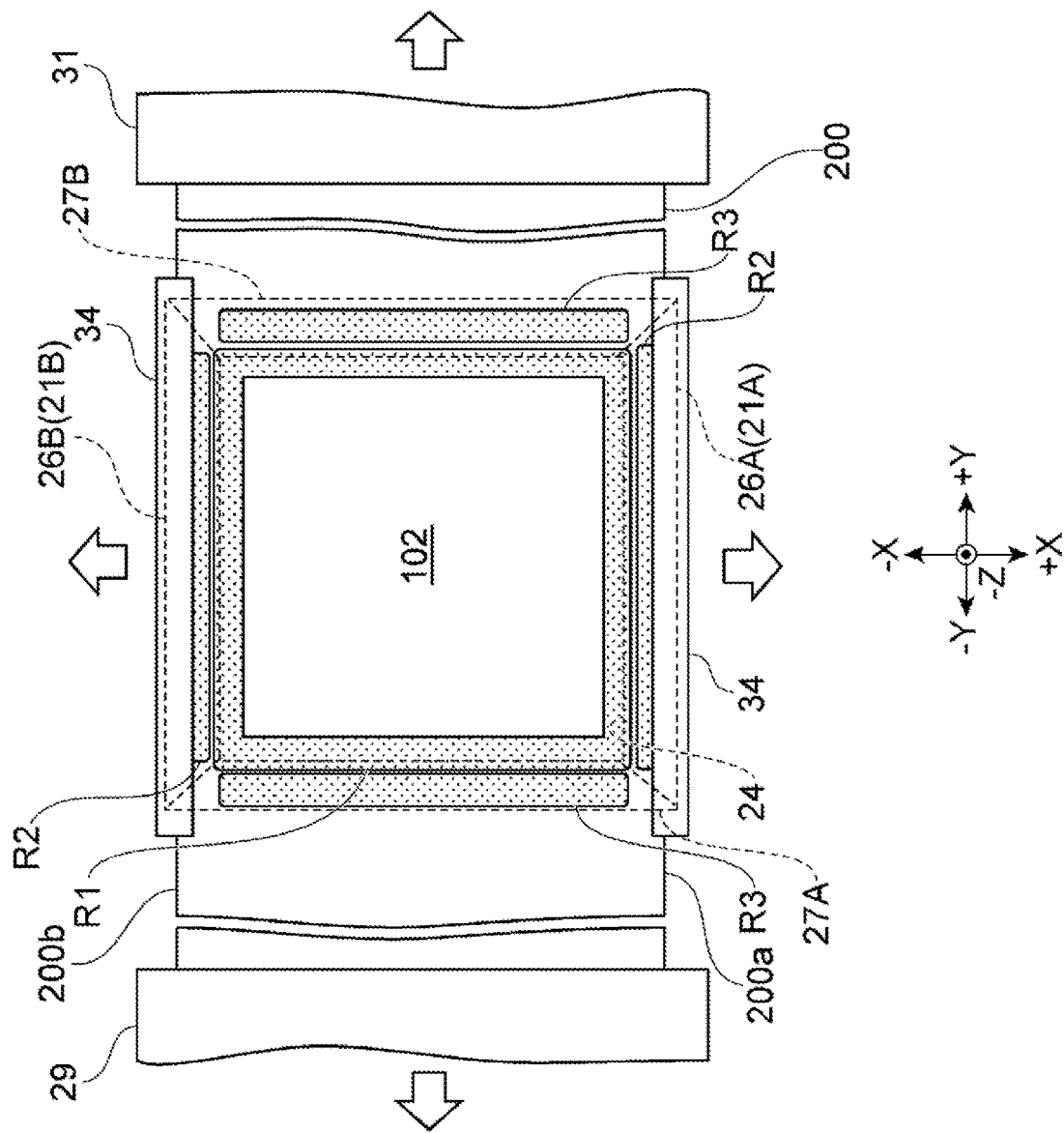
FIG. 10 is a diagram illustrating operations of a bonding apparatus according to the first disclosure.

First, before the semiconductor die 102 is held, the tape 200 covers the entire region of the bonding surface 324 as illustrated in FIG. 9A. Next, after the semiconductor dies 102 are held, a process for causing the semiconductor dies 102 to adhere to the substrate is performed. Here, the bonding apparatus 300 starts heating by controlling the heater. The heat is delivered from the bonding surface 324 to the tape 200. Thereafter, the heat is delivered from the tape 200 to the semiconductor dies 102. Then, the heat eventually reaches the adhesive material. Thus, the tape 200 is heated when the semiconductor dies 102 are caused to adhere to the substrate.

The tape 200 has a predetermined coefficient of thermal expansion. As a result, the tape 200 may decrease in size as compared with its original size due to the temperature rise as illustrated in FIG. 9B. For example, it is assumed that the tape 200 has properties that the tape 200 contracts in the width direction (X-axis direction) in accordance with the temperature rise. When the semiconductor dies 102 are caused to adhere to the substrate, contraction occurs in the tape 200. The width of the tape 200 can be smaller than the width of the bonding surface 324 depending on a degree of the contraction. Thus, a portion that is not covered with the tape 200 occurs in the bonding surface 24. In other words, an exposed portion occurs in the bonding surface 24. A probability that the adhesive crawling upward adheres to the exposed bonding surface 324 occurs.

The bonding apparatus 1 according to the first disclosure bonds the semiconductor dies 102 by thermocompression. Thus, the bonding surface 24 that holds the semiconductor dies 102 is heated in the process for performing the bonding. The heat provided to the bonding surface 24 is delivered to the semiconductor die 102 via the tape 200. Here, in a case in which the tape 200 is heated, the tape 200 is about to be thermally deformed. However, the second part R2 of the tape 200 is constrained by the tape constraining mechanisms 21A and 21B as illustrated in FIG. 10. Therefore, the thermal deformation of the tape 200 is curbed. As a result, the bonding surface 24 that holds the semiconductor 102 is reliably covered with the first portion R1 of the tape 200. Therefore, it is possible to curb the molten adhesive material 103 adhering to the bonding surface 24 and to thereby perform satisfactory bonding.

More specifically, motion of the tape 200 of the bonding apparatus 1 according to the first disclosure in four directions is constrained. Specifically, motion of the tape 200 in the constrained state in the positive and negative transport directions is constrained. Further, motion of the tape 200 in the constrained state in the positive and negative width directions that intersect the transport direction is constrained.

The tape 200 is disposed on the bonding surface 24. The semiconductor dies 102 are held on the tape 200. First, the entire surface of the bonding surface 24 is covered with the first portion R1 of the tape 200. The tape 200 sticks out of the bonding surface 24 in the direction of the tape width (X-axis direction). The portion of the tape 200 sticking out of the bonding surface 24 is the second portion R2 of the tape 200. Also, the second portion R2 of the tape 200 is located on the first tape constraining surfaces 26A and 26B. That is, the second portion R2 of the tape 200 is set such that the first portion R1 of the tape 200 is sandwiched in the direction that is orthogonal to the transport direction (Y-axis direction). Further, the tape 200 includes third portions R3 formed on both sides of the first portion R1 in the transport direction (Y-axis direction). The third portions R3 are located on the tape transport surfaces 27A and 27B of the bonding distal end 23, respectively.

In the aforementioned positional relationship, the supply reel 29 generates a torque in the clockwise direction CW using the supply motor 32 first. Also, the collection reel 31 generates a torque in the counterclockwise direction CCW using the collection motor 33. The respective torques have mutually opposite rotation directions, and the sizes thereof are the same. That is, the tape 200 stands still in a state in which the tape 200 is pulled in the positive and negative transport directions (Y-axis direction). That is, movement of the tape 200 in the positive transport direction (positive Y-axis direction) and the negative transport direction (negative Y-axis direction) is constrained.

Further, the tape constraining frame 34 moves in the positive Z-axis direction using the frame driving mechanism 36. Thus, the second portion R2 of the tape 200 is sandwiched between the tape constraining frame 34 and the bonding distal end 23. Through the sandwiching, frictional force is generated between the tape 200 and the tape constraining frame 34. Further, frictional force is also generated between the tape 200 and the bonding distal end 23. The frictional force acts against force of the tape 200 trying to contract in the width direction thereof. That is, movement of the tape 200 in the positive X-axis direction and the negative X-axis direction is constrained.

In this manner, the heating of the bonding surface 24 is started in the state in which the movement in the four directions is constrained. Through the heating, the temperature of the tape 200 is raised. If the tape 200 is about to be deformed with the temperature rise, a force that acts against the force that tries to cause the deformation is generated in the respective directions. Therefore, the deformation of the tape 200 with the temperature rise is curved. As a result, the bonding surface 24 is not partially exposed.

Also, the "constraining" in the first disclosure is not limited to a meaning that the relative position of the second portion R2 of the tape 200 relative to the first tape constraining surfaces 26A and 26B does not change. For satisfactory bonding, it is only necessary to achieve the state that the tape 200 covers the bonding surface 24 before the heating the bonding tool 12. Therefore, even if contraction occurs in the width direction of the tape 200 due to the temperature rise, a state in which the contraction slowly advances due to the force caused by the tape constraining mechanisms 21A and 21B, and a state in which the tape 200 covers the bonding surface 24 is achieved in one bonding process can also be included.

Also, the first tape constraining surfaces 26A and 26B at the bonding distal end 23 are continuous with the bonding surface 24 via the first boundary side part 24a (see FIG. 4A). The bonding distal end 23 has a tapered shape that becomes thinner toward the bonding surface 24. Therefore, it is possible to perform bonding that is compatible with a decrease in pitch.

Also, the sheet member has a tapered shape. With this configuration, it is possible to successively supply the sheet member to the bonding tool 12.

<Second disclosure>

Figure 11:
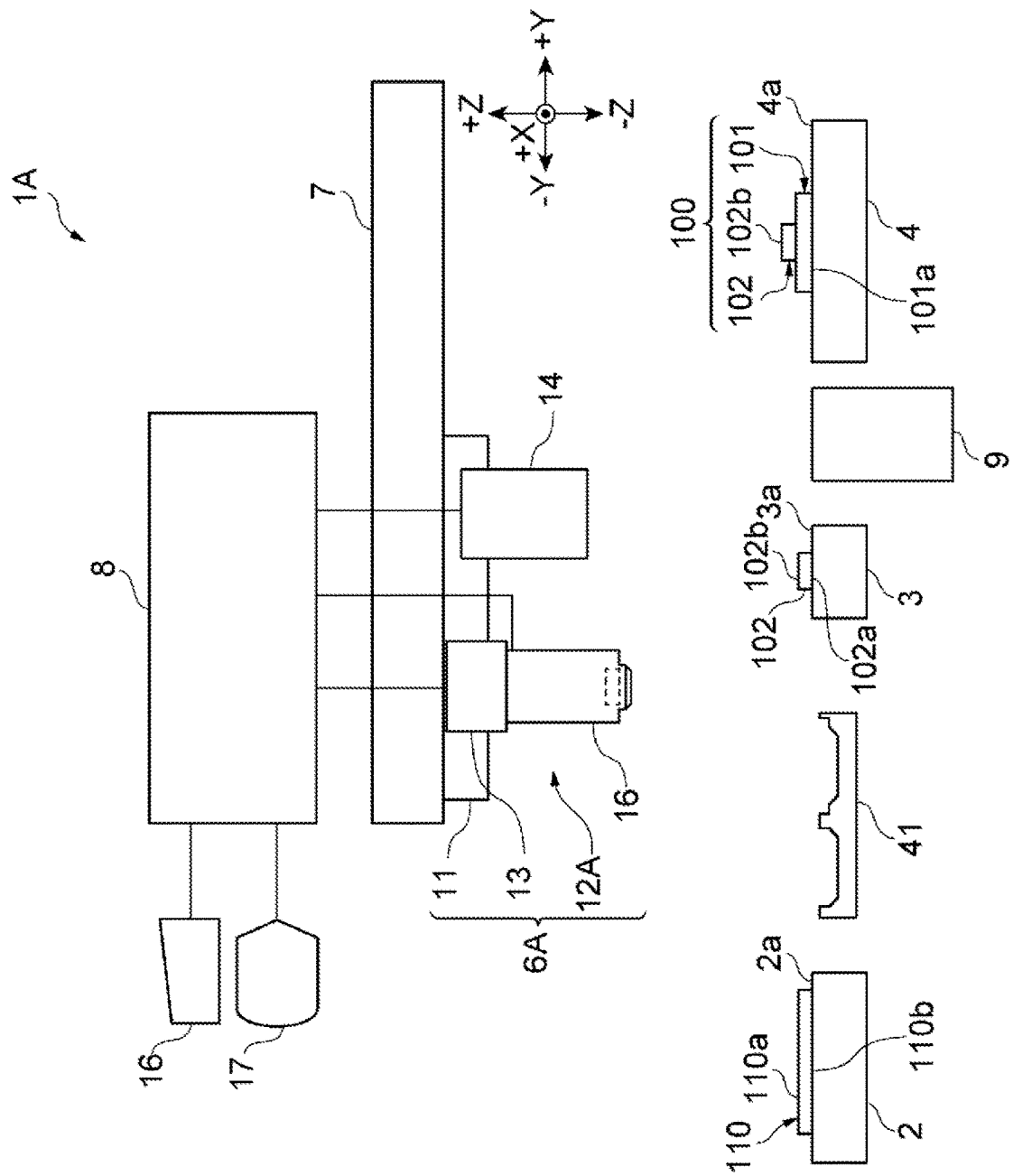
FIG. 11 is an outline diagram illustrating a configuration of a bonding apparatus according to the second disclosure.

A bonding apparatus 1A illustrated in FIG. 11 will be described. The bonding apparatus 1A is different from the bonding apparatus 1 according to the first disclosure in that the bonding apparatus 1A uses a sheet piece in a state of an individual piece instead of a tape shape as the sheet member. Hereinafter, components that are different from those in the bonding apparatus 1 will be described in detail, and components common to those in the bonding apparatus 1 will be described with the same reference numerals. Therefore, detailed description of the common components will be omitted.

The bonding apparatus 1A has a wafer stage 2, an intermediate stage 3, a bonding stage 4, a bonding unit 6A, an XY stage 7, a bonding control part (hereinafter, simply referred to as a "control part 8"), and an imaging part 9. In these configurations, the bonding unit 6A has a different configuration from that of the bonding unit 6. Specifically, the bonding unit 6A does not have the tape transport mechanism 19. Also, the bonding apparatus 1A further has a sheet constraining stage 41 in addition to these configurations. The sheet constraining stage 41 is disposed between the wafer stage 2 and the bonding stage 4. For example, the sheet constraining stage 41 is disposed between the wafer stage 2 and the intermediate stage 3. The bonding unit 6A has a bonding head 11, a bonding tool 12A, a Z-axis driving mechanism 13, and an imaging part 14. In these configurations, the bonding tool 12A has a different configuration from that of the bonding tool 12.

Figure 12A:
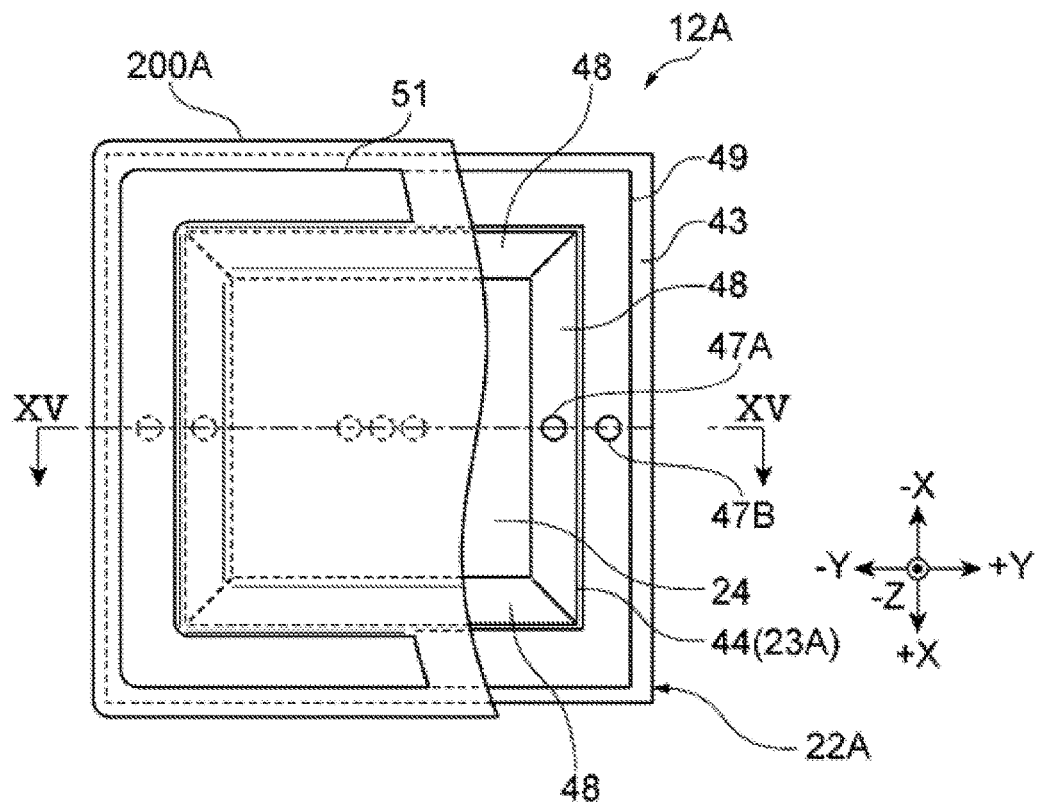
FIG. 12A is a plan view of a bonding tool illustrated in FIG. 11.
Figure 12B:
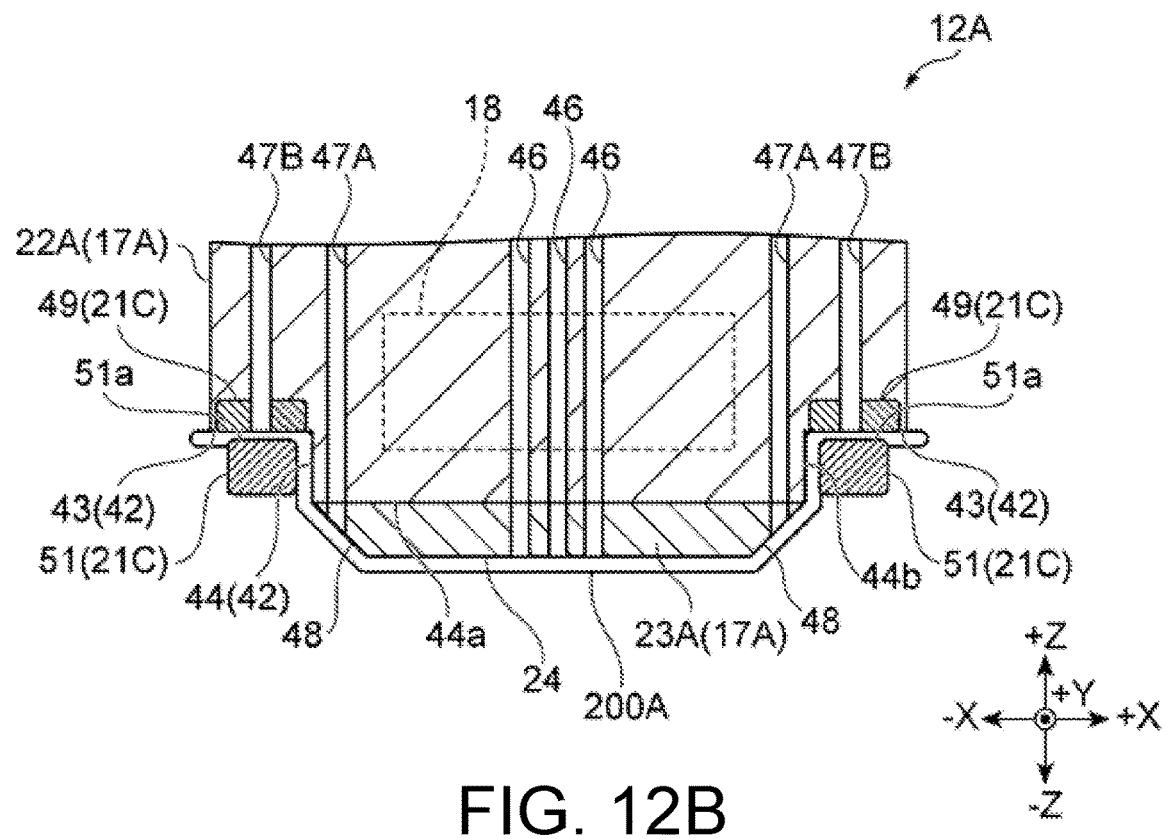
FIG. 12B is a sectional view taken along the line XV-XV illustrated in FIG. 12A.

As illustrated in FIGS. 12A and 12B, the bonding tool 12A has a body 17A, a heater 18, and a sheet constraining mechanism 21C. In these configurations, the body 17A has a different configuration from that of the body 17. Also, the sheet constraining mechanism 21C has a different configuration from those of the tape constraining mechanisms 21A and 21B.

The body 17A has a base part 22A and a bonding distal end 23A. The base part 22A has a square columnar shape. Also, the base part 22A may have a circular columnar shape. An upper end of the base part 22A is coupled to the Z-axis driving mechanism 13. A lower end of the base part 22A is attached to the bonding distal end 23A. A stepped part 42 is provided at the lower end of the base part 22A. The stepped part 42 has an annular plane part 43 and a projecting part 44. The projecting part 44 projects in the negative Z-axis direction from the annular plane part 43. The central axial line of the projecting part 44 overlaps with the central axial line of the annular plane part 43. That is, the projecting part 44 is provided coaxially with the annular plane part 43. The bonding distal end 23A is attached to a lower surface 44a of the projecting part 44. Also, the bonding distal end 23A may be formed integrally with the body 17A.

The body 17A has at least one die suctioning hole 46 and at least one sheet suctioning holes 47A and 47B. The die suctioning hole 46 is a hole that penetrates through the body 17A. A lower end of the die suctioning hole 46 forms an opening in the bonding surface 24 of the bonding distal end 23A. The sheet suctioning hole 47A is also a hole that penetrates through the body 17A. A lower end of the sheet suctioning hole 47A forms an opening in a tapered surface 48 of the bonding distal end 23A. In addition, a lower end of the other sheet suctioning hole 47B forms an opening in the annular plane part 43 of the body 17A.

The sheet constraining mechanism 21C has an adsorption part 49 and a constraining frame 51. The sheet constraining mechanism 21C sandwiches a sheet 200A between the adsorption part 49 and the constraining frame 51. As a result, the sheet 200A is constrained. The adsorption part 49 is an electromagnet incorporated in the base part 22A, for example. According to the electromagnet, the control part 8 can control adsorption and release of the constraining frame 51. The electromagnet that serves as the adsorption part 49 is incorporated in the base part 22A such that the surface thereof is exposed to the annular plane part 43. Also, the constraining frame 51 is a frame body. The constraining frame 51 is formed using a magnetic material with a square shape surrounding the projecting part 44. The constraining frame 51 has an opening. The opening has an inner dimension that is slightly larger than the outer shape of the projecting part 44. Also, the constraining frame 51 has a constraining surface 51a that faces the annular plane part 43. That is, the constraining surface 51a of the constraining frame 51 faces the adsorption part 49 that is exposed to the annular plane part 43 via the sheet 200A.

In such a sheet constraining mechanism 21C, the sheet 200A covers a lower part of the base part 22A and the bonding distal end 23A. Specifically, the sheet 200A covers the annular plane part 43 of the base part 22A and a side surface 44b of the projecting part 44. In addition, the sheet 200A covers the tapered surface 48 of the bonding distal end 23A and the bonding surface 24. A part (second portion R2) of the sheet 200A located on the annular plane part 43 of the base part 22A is sandwiched between the adsorption part 49 and the constraining frame 51 in the Z-axis direction. As a result, the second part R2 is constrained. A part (first part R1) of the sheet 200A located on the bonding surface 24 covers the bonding surface 24. As a result, adhesion of the adhesive material to the bonding surface 24 and the like are curbed.

Figure 13:
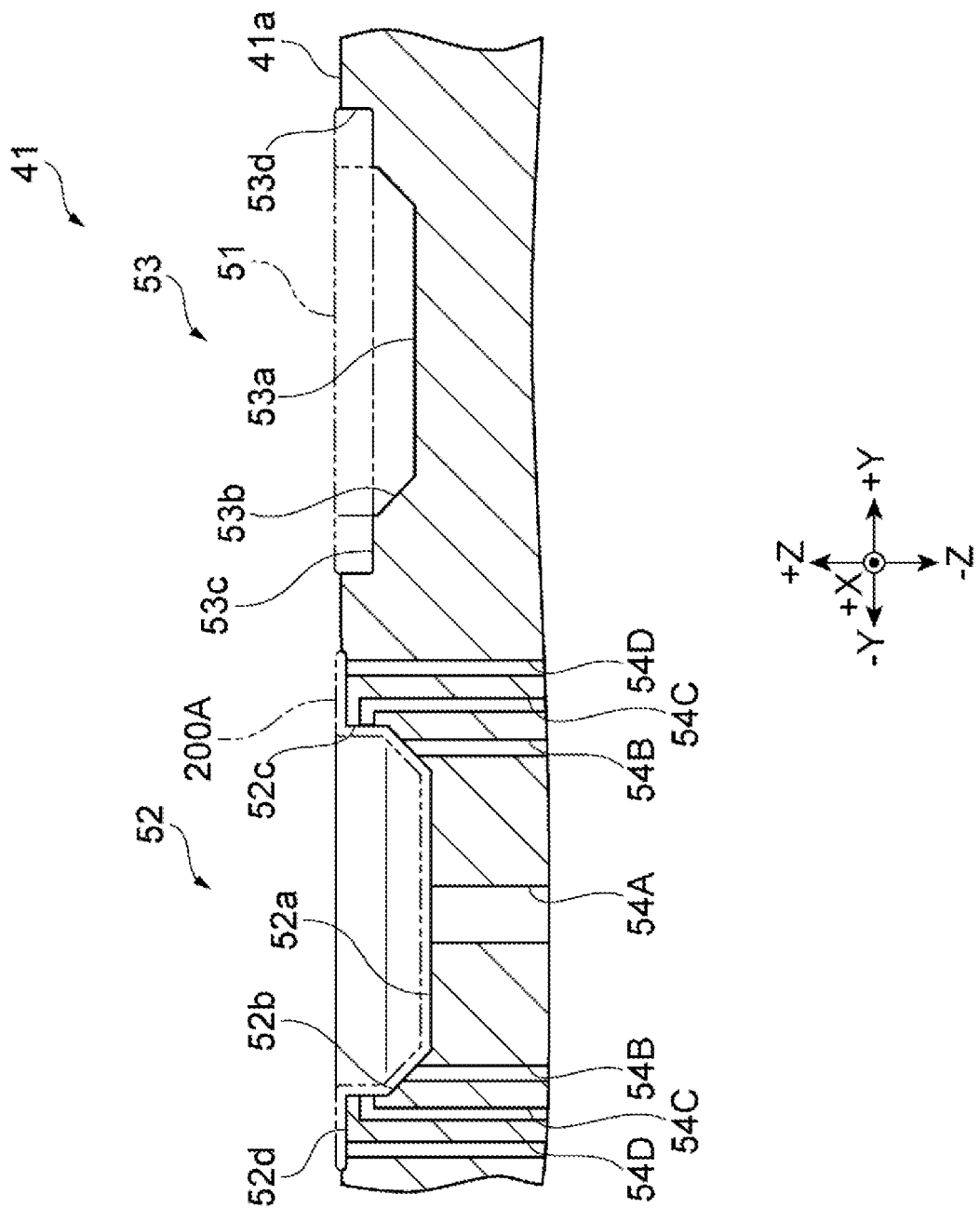
FIG. 13 is a sectional view of a sheet constraining stage illustrated in FIG. 11.

Next, the sheet constraining stage 41 will be described. As illustrated in FIG. 13, the sheet constraining stage 41 provides the sheet 200A and the constraining frame 51 to the bonding tool 12A. The sheet constraining stage 41 is a plate-shaped member, for example. The sheet constraining stage 41 has a sheet supply part 52 and a frame supply part 53 that are provided in parallel on a main surface 41a.

The sheet supply part 52 is a recessed part in which the sheet 200A is placed. The shape of the sheet supply part 52 follows the outer shapes of the bonding distal end 23A and the projecting part 44. That is, the inner shape of the sheet supply part 52 is slightly larger than the outer shape of the bonding distal end 23A and is slightly larger than the outer shape of the projecting part 44 (corresponding to the thickness of the sheet 200A, for example). In addition, the sheet supply part 52 has a bottom surface 52a, an oblique surface 52b that is continuous with the bottom surface 52a, a wall surface 52c that is continuous with the oblique surface 52b, and a shoulder surface 52d that is continuous with the wall surface 52c. The sheet 200A is placed on the bottom surface 52a, the oblique surface 52b, the wall surface 52c, and the shoulder surface 52d in advance. The sheet supply part 52 has a plurality of suctioning holes 54A, 54B, 54C, and 54D for holding the sheet 200A. The suctioning hole 54A forms an opening in the bottom surface 52a. The suctioning hole 54B forms an opening in the oblique surface 52b. The suctioning hole 54C forms an opening in the wall surface 52c. The suctioning hole 54D forms an opening in the shoulder surface 52d. With such a configuration, the sheet 200A follows the inner shape of the sheet supply part 52. As a result, the sheet 200A is reliably provided to the bonding tool 12A.

The frame supply part 53 is a frame recessed part in which the constraining frame 51 is placed. The inner shape of the frame supply part 53 follows the outer shape of the bonding distal end 23A and the outer shape of the constraining frame 51. The frame supply part 53 has a bottom surface 53a, an oblique surface 53b that is continuous with the bottom surface 53a, a shoulder surface 53c that is continuous with the oblique surface 53b, and wall surfaces 53d that are continuous with the shoulder surface 53c. The constraining frame 51 is placed on the shoulder surface 53c. That is, an interval between the wall surfaces 53d corresponds to the outer dimension of the constraining frame 51.

Figure 14:
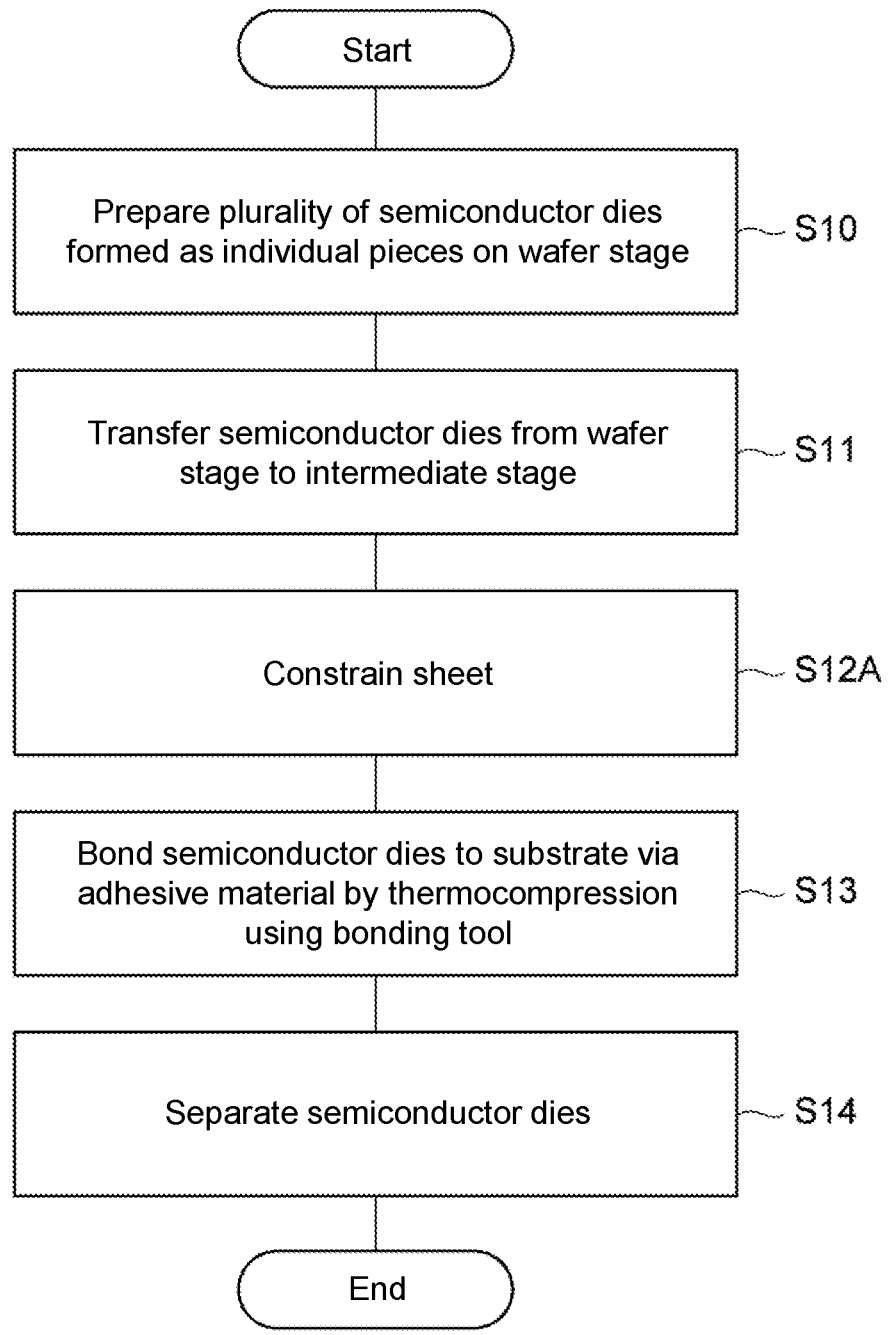
FIG. 14 is a flow diagram illustrating main processes of a bonding method using the bonding apparatus illustrated in FIG. 11.

Hereinafter, a bonding method using the bonding apparatus 1A will be described with reference to FIGS. 14, 15A and 15B, and 16A and 16B. As illustrated in FIG. 14, the bonding method according to the second disclosure is different from the bonding method according to the first disclosure only in a process for constraining the sheet 200A to the bonding tool 12A (process S12A). Therefore, the process for preparing a plurality of semiconductor dies formed as individual pieces on a wafer stage (process S10), the process for transferring the semiconductor dies from a wafer stage to an intermediate stage (process S11), a process for bonding the semiconductor dies to a substrate through an adhesive material by thermocompression using a bonding tool (process S13), and the process for separating the semiconductor dies (process S14) are the same as those in the bonding method according to the first disclosure. Therefore, detailed description of these processes will be omitted.

First, the control part 8 performs the process for preparing the plurality of semiconductor dies 102 formed as individual pieces on the wafer stage (process S10) and the process for transferring the semiconductor dies 102 from the wafer stage 2 to the intermediate stage 3 (process S11).

Next, the control part 8 performs a process for constraining the sheet 200A to the bonding tool 12A (process S12A).

Figure 15A:
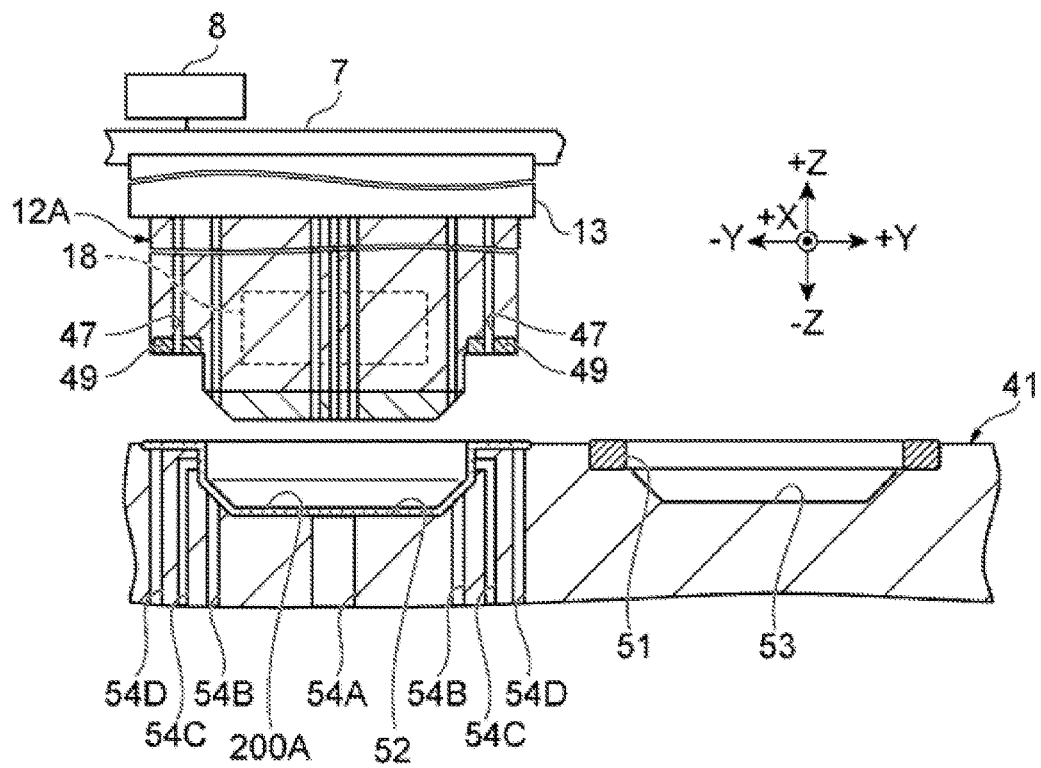
FIG. 15A is a sectional view illustrating a bonding tool in a process for constraining a sheet.

Specifically, the control part 8 controls the XY stage 7 as illustrated in FIG. 15A. As a result, the bonding tool 12A moves to the above of the sheet supply part 52 of the sheet constraining stage 41. At this time, the control part 8 controls an air pressure system (not illustrated) connected to the suctioning holes 54A, 54B, 54C, and 54D provided on the sheet constraining stage 41. As a result, the sheet 200A is adsorbed to the inner surface of the sheet supply part 52.

Figure 15B:
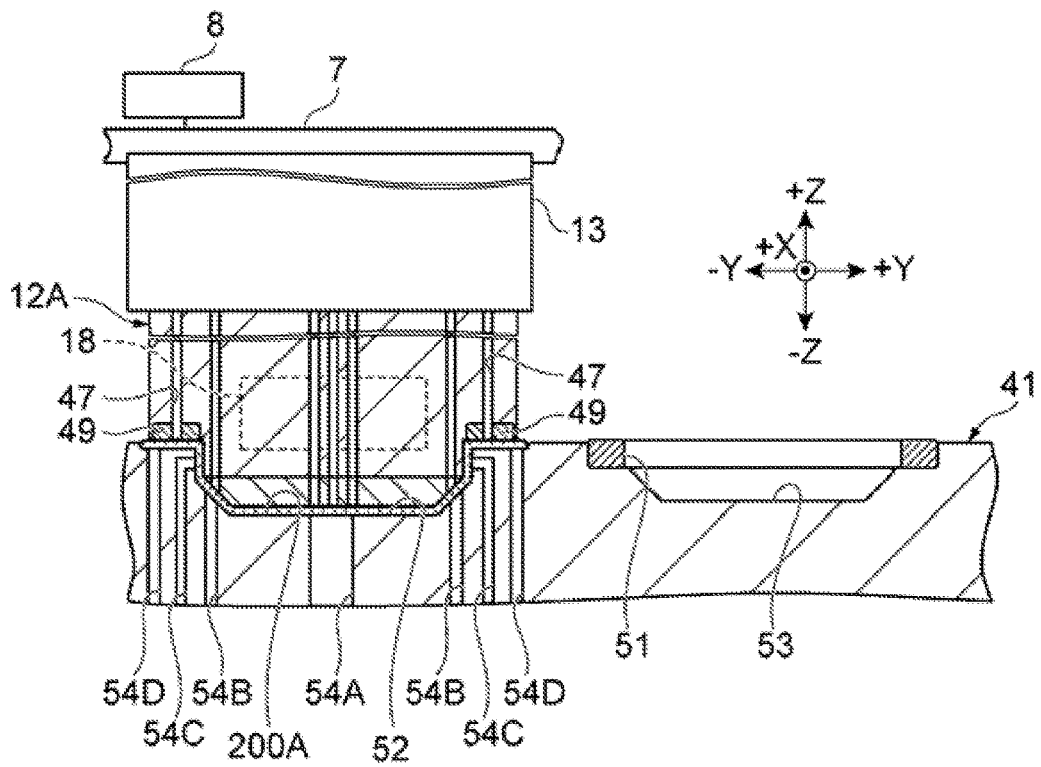
FIG. 15B is a diagram illustrating a process performed after the process illustrated in FIG. 15A.

Next, the control part 8 controls the Z-axis driving mechanism 13 as illustrated in FIG. 15B. As a result, the bonding tool 12A moves in the negative Z-axis direction. Through the movement, the bonding tool 12A is inserted into the sheet supply part 52. After the insertion, the control part 8 controls the air pressure system (not illustrated) connected to the sheet suctioning hole 47 provided in the bonding tool 12A. As a result, suctioning of the sheet 200A to the bonding tool 12A is started. In addition, the control part 8 stops the suctioning of the sheet 200A to the sheet constraining stage 41.

Figure 16A:
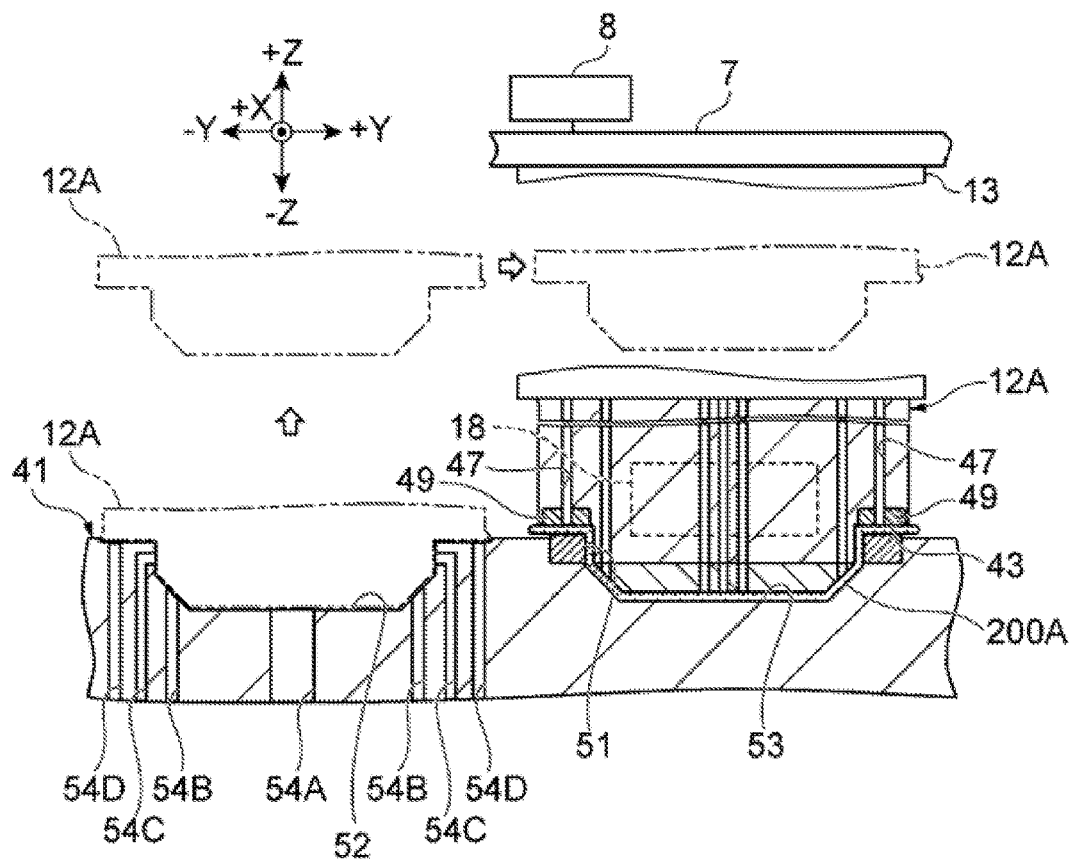
FIG. 16A is a sectional view illustrating the bonding tool in the process for constraining a sheet.

Next, the control part 8 controls the Z-axis driving mechanism 13 as illustrated in FIG. 16A. As a result, the bonding tool 12A moves in the positive Z-axis direction. Then, the control part 8 controls the XY stage 7. As a result, the bonding tool 12A moves to the above of the frame supply part 53 of the sheet constraining stage 41. Next, the control part 8 controls the Z-axis driving mechanism 13. As a result, the bonding tool 12A moves in the negative Z-axis direction. Through the movement, the bonding tool 12A is inserted into the frame supply part 53. At this time, the control part 8 does not allow the adsorption part 49 that is an electromagnet to generate a magnetic force. Then, when the insertion is completed, and a state in which the constraining frame 51 is pressed against the annular plane part 43 via the sheet 200A is achieved, the control part 8 causes the adsorption part 49 that is an electromagnet to generate a magnetic force. Through the operation, the constraining frame 51 is secured to the bonding tool 12A. That is, the sheet 200A is constrained.

Figure 16B:
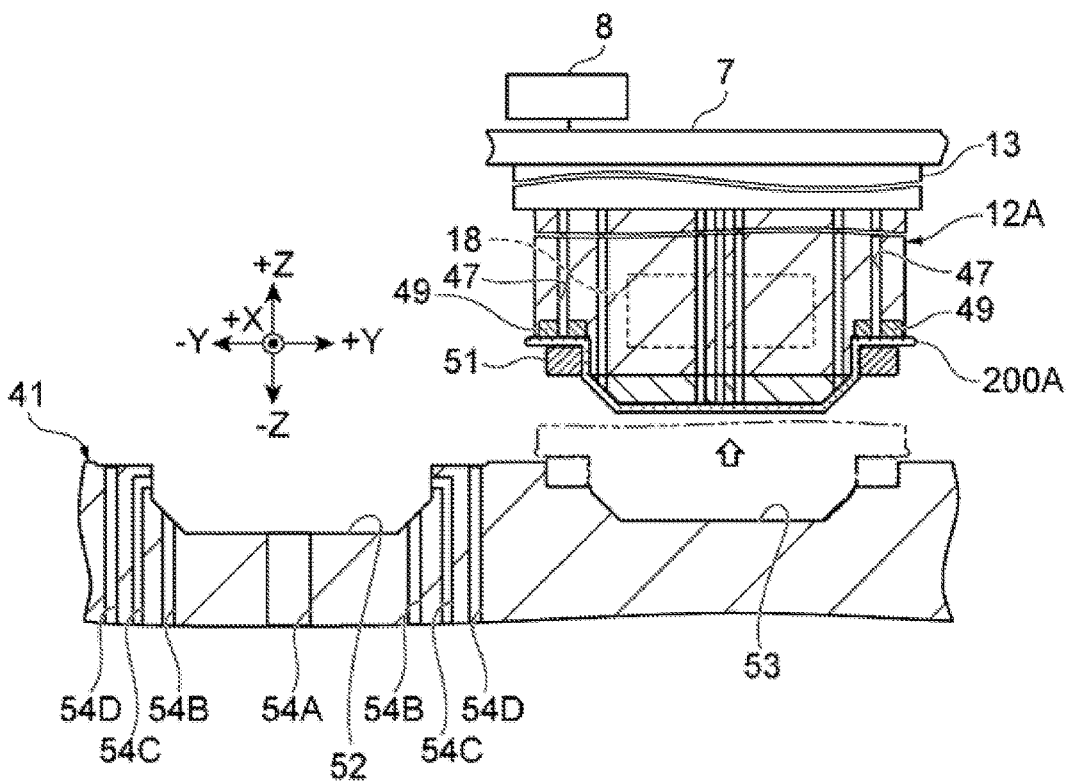
FIG. 16B is a diagram illustrating a process performed after the process illustrated in FIG. 16A.

Next, the control part 8 controls the Z-axis driving mechanism 13 as illustrated in FIG. 16B. As a result, the bonding tool 12A moves in the positive Z-axis direction.

Then, the control part 8 performs the process for bonding the semiconductor dies 102 to the substrate 101 through the adhesive material 103 by thermocompression using the bonding tool 12A (process S13) and the process for separating the semiconductor dies 102 (process S14).

Thermal deformation of the sheet 200A is curbed in the bonding apparatus 1A according to the second disclosure as well similarly to the bonding apparatus 1 according to the first disclosure. As a result, the bonding surface 24 that holds the semiconductor die 102 is reliably covered with the sheet 200A. Therefore, adhesion of the molten adhesive material 103 to the bonding surface 24 is curbed. As a result, it is possible to perform satisfactory bonding.

MODIFICATION EXAMPLE

The bonding apparatus according to the disclosure has been described above in detail. However, the disclosure is not limited to the aforementioned configurations. Various modifications can be made for the bonding apparatus according to the disclosure without departing from the gist thereof. For example, FIG. 17, FIG. 18, FIG. 19, FIG. 20, FIG. 21, and FIG. 22 are diagrams illustrating bonding tools of bonding apparatuses according to modification examples 1 to 6 in an enlarged manner.

Figure 17:
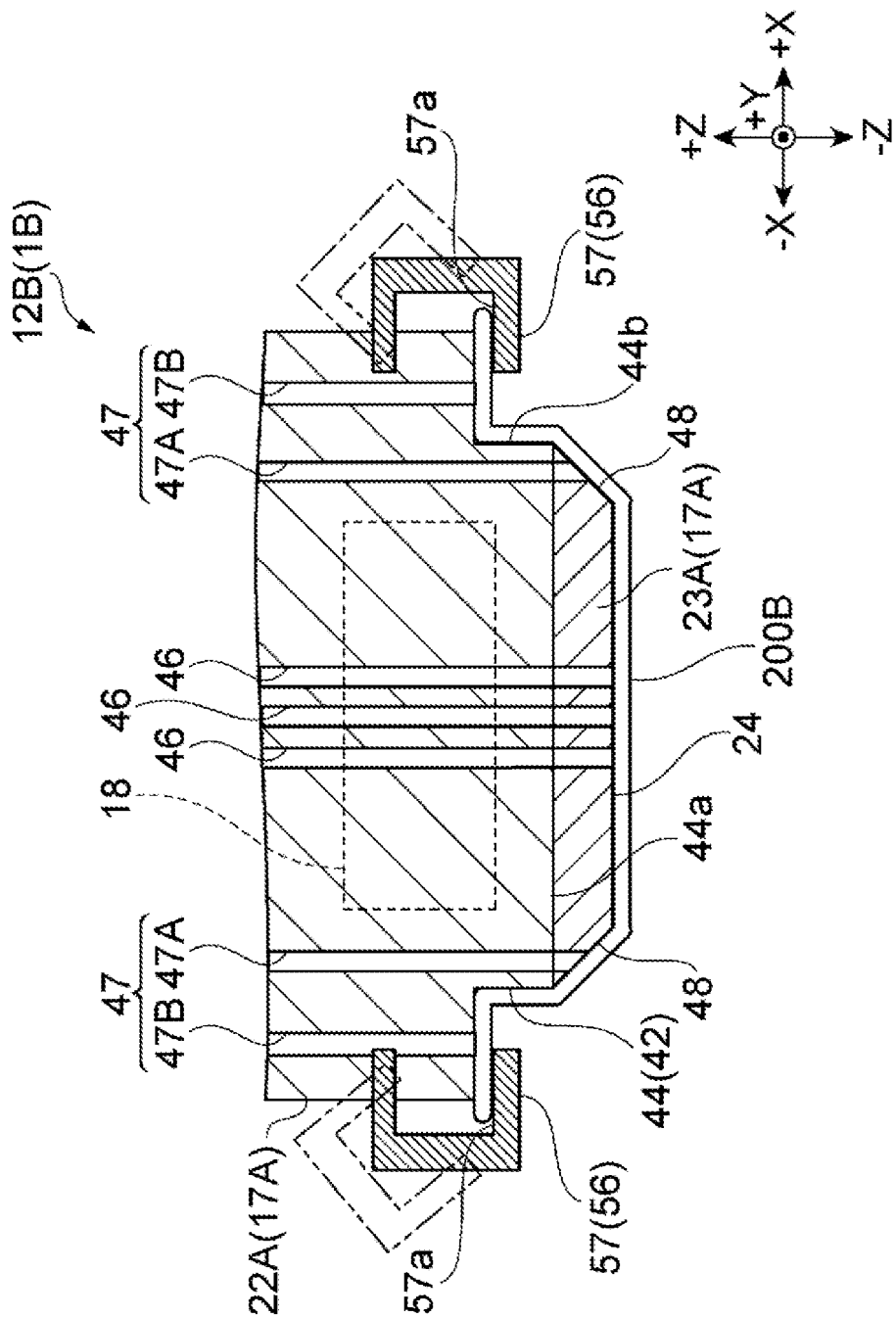
FIG. 17 is an enlarged view of a bonding tool in a bonding apparatus according to a first modification example.

For example, it is only necessary for the sheet constraining part to constrain the sheet member to such an extent that the bonding surface 24 can be continuously covered when the temperature of the sheet is raised. Therefore, a specific configuration for constraining the sheet member is not limited to the configurations described above in the first disclosure and the second disclosure. As illustrated in FIG. 17, for example, a sheet 200B may be constrained by a sheet gripping mechanism 56 provided at a bonding tool 12B of a bonding apparatus 1B. The sheet gripping mechanism 56 has a clip 57 that can be turned about a predetermined rotation axis. A gripping surface 57a of the clip 57 grips an end of the sheet 200B.

Figure 18:
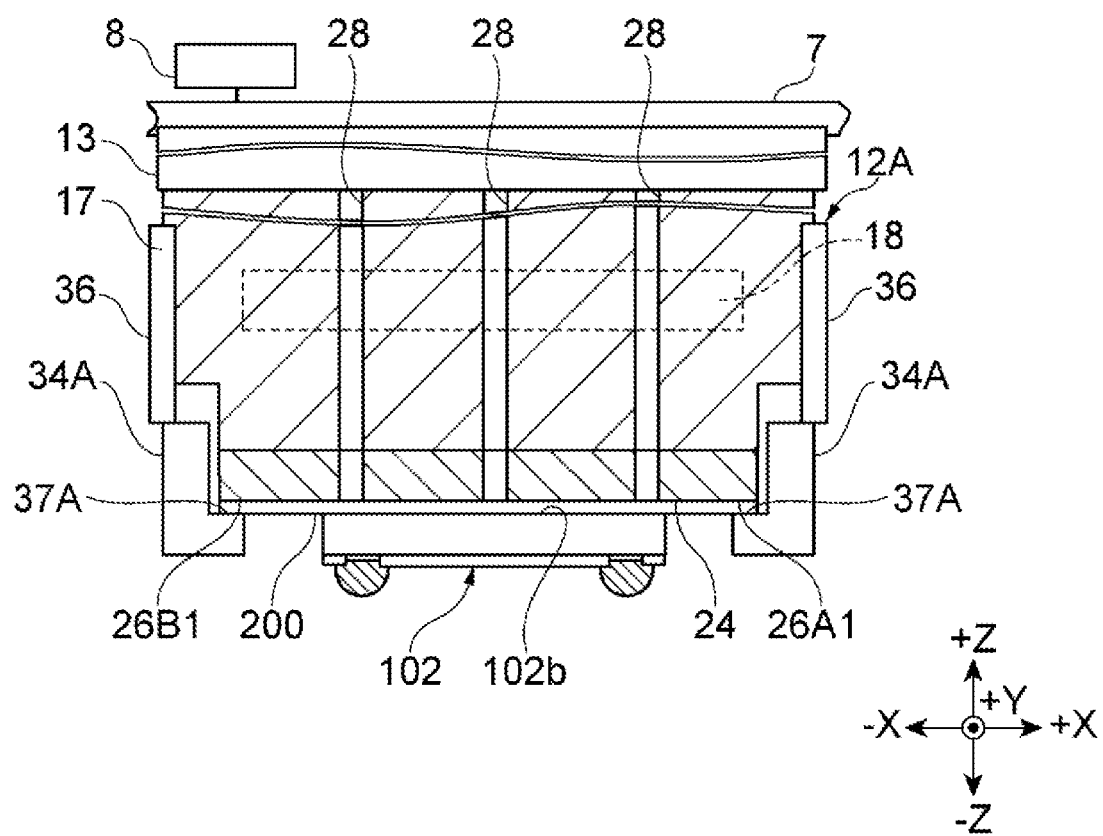
FIG. 18 is an enlarged view of a bonding tool in a bonding apparatus according to a second modification example.

Also, the first tape constraining surfaces 26A and 26B and the second tape constraining surface 37 are not limited to the tapered shapes in the first disclosure. As illustrated in FIG. 18, for example, the tape 200 may be sandwiched and constrained with flat first tape constraining surfaces 26A1 and 26B1 and a flat second tape constraining surface 37A. The first tape constraining surfaces 26A1 and 26B1 are set in the same surface as the bonding surface 24. Further, the first tape constraining surfaces 26A1 and 26B1 are set in a frame shapes so as to surround the bonding surface 24. A tape constraining frame 34A has a second tape constraining surface 37A. The second tape constraining surface 37A faces the first tape constraining surfaces 26A1 and 26B1. The tape constraining frame 34A presses the second tape constraining surface 37A against the first tape constraining surfaces 26A1 an 26B1 via the tape 200 by moving in the positive Z-axis direction.

Figure 19:
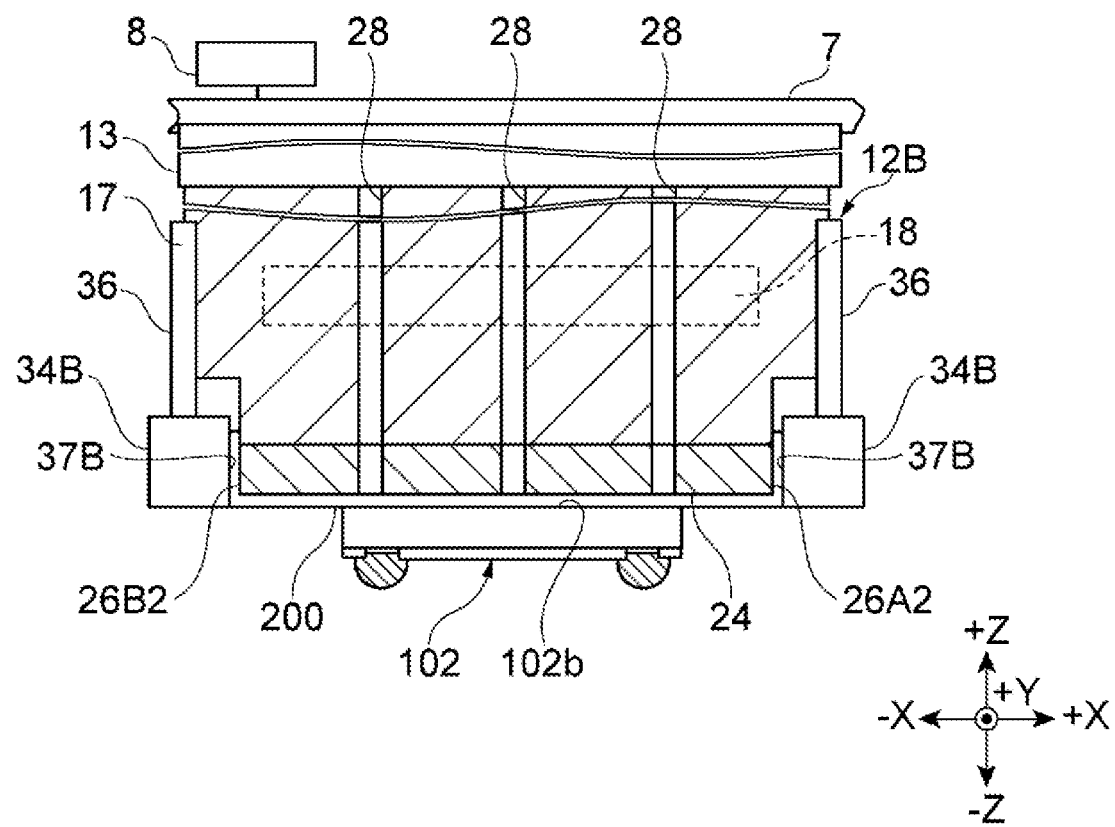
FIG. 19 is an enlarged view of a bonding tool in a bonding apparatus according to a third modification example.

Also, first tape constraining surfaces 26A2 and 26B2 may be vertical to the bonding surface 24 as illustrated in FIG. 19, for example. The tape constraining frame 34B presses the second tape constraining surface 37B against the first tape constraining surfaces 26A2 and 26B2 via the tape 200 by moving in the X-axis direction.

Figure 20:
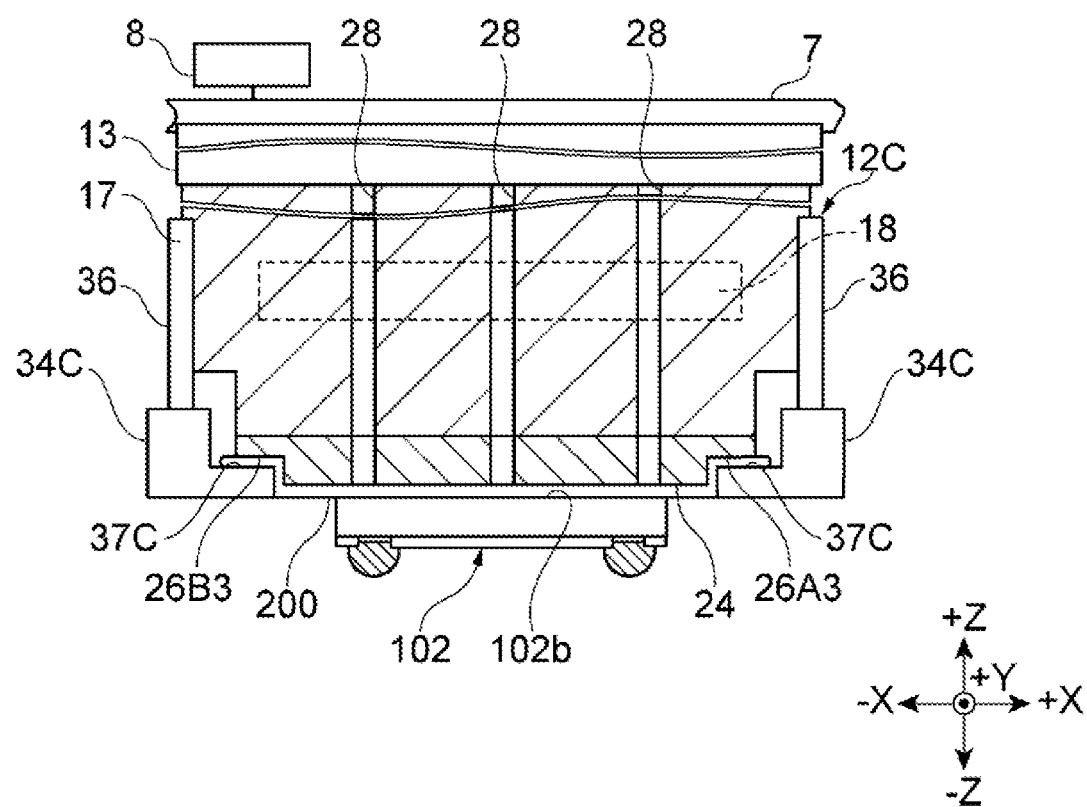
FIG. 20 is an enlarged view of a bonding tool in a bonding apparatus according to a fourth modification example.

Further, first tape constraining surfaces 26A3 and 26B3 may be stepped parts that have surfaces that are at a substantially right angle relative to the bonding surface 24 as illustrated in the bonding tool 12C shown in FIG. 20. A second tape constraining surface 37C of a tape constraining frame 34C sandwiches and constrains the sheet so as to mesh with the stepped parts.

Figure 21:
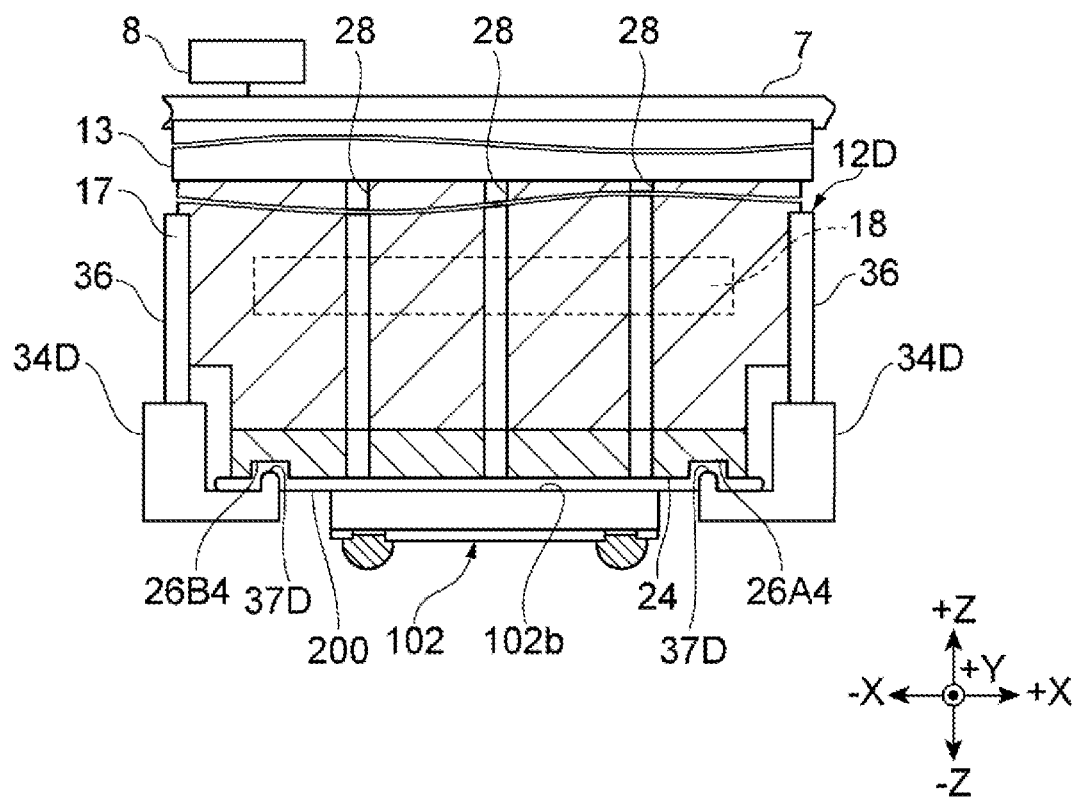
FIG. 21 is an enlarged view of a bonding tool in a bonding apparatus according to a fifth modification example.

Further, first tape constraining surfaces 26A4 and 26B4 may be grooves provided in a circumferential edge of the bonding surface 24 as illustrated in the bonding tool 12D shown in FIG. 21. A second tape constraining surface 37D of a tape constraining frame 34D sandwiches and constrains the sheet so as to mesh with the grooves. The first tape constraining surfaces 26A4 and 26B4 are bottom surfaces of the grooves.

Figure 22:
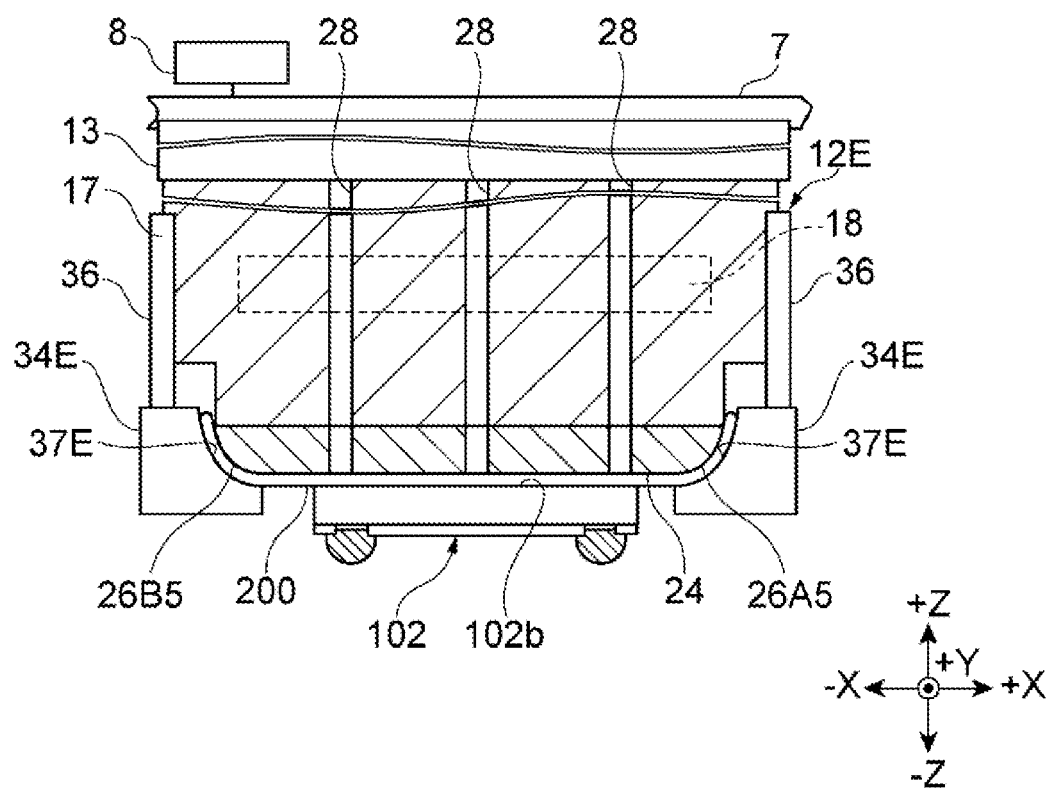
FIG. 22 is an enlarged view of a bonding tool in a bonding apparatus according to a sixth modification example.

Further, first tape constraining surfaces 26A5 and 26B5 and a second tape constraining surface 37E of a tape constraining frame 34E may be curved surfaces as illustrated in the bonding tool 12E shown in FIG. 22.

The invention claimed is:

1. A bonding apparatus which bonds an electronic component to a substrate or another electronic component by thermocompression through an adhesive material, the bonding apparatus comprising:
   a bonding tool which has a bonding surface that detachably holds the electronic component through a first portion of a sheet member with air permeability, and a pair of first sheet constraining surfaces that are arranged on both sides of the bonding surface to sandwich the bonding surface on an axial line that is parallel to the bonding surface and constrain a second portion of the sheet member;
   sheet constraining parts which have a second sheet constraining surface that presses the sheet member on the first sheet constraining surfaces against the first sheet constraining surfaces and which constrain the second portion of the sheet member sandwiched between the first sheet constraining surfaces and the second sheet constraining surface; and
   a bonding control part which controls operations of the bonding tool and the sheet constraining parts.

2. The bonding apparatus according to claim 1, wherein the bonding tool has a heating part that raises a temperature of the bonding surface, and
   the bonding control part starts heating of the heating part after the sheet constraining parts constrain the second portion of the sheet member.

3. The bonding apparatus according to claim 1, wherein the first sheet constraining surfaces are continuous with the bonding surface through a boundary side part.

4. The bonding apparatus according to claim 1, wherein the sheet member has a tape shape,
   the bonding apparatus further includes a sheet supply part, wherein the sheet supply part comprises:
      a first reel, to which one end of the sheet member is coupled, which lets off the sheet member and provides the sheet member; and
      a second reel, to which the other end of the sheet member is coupled, which rewinds the sheet member provided from the first reel,
   the bonding tool is disposed between the first reel and the second reel, and
   the sheet constraining parts constrain a pair of free side parts that serve as the second portion of the sheet member.

5. The bonding apparatus according to claim 1, wherein the sheet member is a sheet with an individual piece shape, and
   the sheet constraining parts constrain at least a pair of free side parts that serve as the second portion of the sheet member.

6. The bonding apparatus according to claim 2, wherein the first sheet constraining surfaces are continuous with the bonding surface through a boundary side part.

7. The bonding apparatus according to claim 2, wherein the sheet member has a tape shape,
   the bonding apparatus further includes a sheet supply part, wherein the sheet supply part comprises:
      a first reel, to which one end of the sheet member is coupled, which lets off the sheet member and provides the sheet member; and
      a second reel, to which the other end of the sheet member is coupled, which rewinds the sheet member provided from the first reel,
   the bonding tool is disposed between the first reel and the second reel, and
   the sheet constraining parts constrain a pair of free side parts that serve as the second portion of the sheet member.

8. The bonding apparatus according to claim 2, wherein the sheet member is a sheet with an individual piece shape, and
   the sheet constraining parts constrain at least a pair of free side parts that serve as the second portion of the sheet member.

9. A bonding method in which an electronic component is bonded to a substrate or another electronic component by thermocompression through an adhesive material, the bonding method comprising:
   preparing a bonding tool which has a bonding surface that detachably holds the electronic component through a first portion of a sheet member with air permeability, and a pair of first sheet constraining surfaces that are arranged on both sides of the bonding surface to sandwich the bonding surface on an axial line that is parallel to the bonding surface and constrain a second portion of the sheet member;
   disposing the first portion of the sheet member on the bonding surface, disposing the second portion of the sheet member on the first sheet constraining surfaces, and then constraining the second portion with sheet constraining parts, the sheet constraining parts having a second sheet constraining surface that presses the sheet member on the first sheet constraining surfaces against the first sheet constraining surfaces and constraining the second portion of the sheet member sandwiched between the first sheet constraining surfaces and the second sheet constraining surface;
   holding the electronic component on the bonding surface through the first portion of the sheet member; and
   heating the bonding surface with a heating part that the bonding tool has and bonding the electronic component to the substrate or the other electronic component by thermocompression through an adhesive.

* * * * *